(12) United States Patent
Hsieh et al.

(10) Patent No.: US 12,463,157 B2
(45) Date of Patent: Nov. 4, 2025

(54) ELECTRONIC PACKAGE

(71) Applicant: Advanced Semiconductor Engineering, Inc., Kaohsiung (TW)

(72) Inventors: Meng-Wei Hsieh, Kaohsiung (TW); Hung-Yi Lin, Kaohsiung (TW); Hsu-Chiang Shih, Kaohsiung (TW); Cheng-Yuan Kung, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 875 days.

(21) Appl. No.: 17/566,569

(22) Filed: Dec. 30, 2021

(65) Prior Publication Data

US 2023/0215822 A1 Jul. 6, 2023

(51) Int. Cl.
| | |
|---|---|
| H01L 23/66 | (2006.01) |
| H01L 23/31 | (2006.01) |
| H01L 23/367 | (2006.01) |
| H01L 23/498 | (2006.01) |
| H01L 25/18 | (2023.01) |
| H03F 3/04 | (2006.01) |

(52) U.S. Cl.
CPC .......... *H01L 23/66* (2013.01); *H01L 23/3107* (2013.01); *H01L 23/367* (2013.01); *H01L 23/49811* (2013.01); *H01L 25/18* (2013.01); *H03F 3/04* (2013.01); *H01L 2223/6655* (2013.01)

(58) Field of Classification Search
CPC ... H01L 23/66; H01L 23/3107; H01L 23/367; H01L 23/49811; H01L 25/18; H01L 2223/6655; H01L 2221/68345; H01L 2221/68359; H01L 2225/06513; H01L 2225/06524; H01L 21/6835; H01L 2225/06548; H01L 24/82; H01L 23/49816; H01L 23/5385; H01L 25/0652; H01L 25/105; H01L 2225/1058; H01L 2225/1094; H01L 23/5389; H01L 23/36; H01L 25/0655; H01L 25/50; H01L 2225/06589; H03F 3/04
USPC .......................................................... 330/149
See application file for complete search history.

(56) References Cited

U.S. PATENT DOCUMENTS

| | | |
|---|---|---|
| 8,446,017 B2 | 5/2013 | Paek et al. |
| 10,818,515 B2 | 10/2020 | Yeh et al. |

(Continued)

OTHER PUBLICATIONS

Furnival, Courtney R., "Small Leadless-SMD Packages Replacing Large Modules for High Power GaN and SiC Products", May 2, 2017, 7 pages, https://www.powersystemsdesign.com/articles/small-leadless-smd-packages-replacing-large-modules-for-high-power-gan-and-sic-products/28/11 . . . .

*Primary Examiner* — Andrea Lindgren Baltzell
*Assistant Examiner* — Jose E Pinero
(74) *Attorney, Agent, or Firm* — FOLEY & LARDNER LLP

(57) ABSTRACT

An electronic package is provided. The electronic package includes an amplifier component, a control component, and a first circuit layer. The control component is disposed above the amplifier component. The first circuit layer is disposed between the amplifier component and the control component. The control component is configured to transmit a first signal to the amplifier component and to output a second signal amplified by the amplifier component.

20 Claims, 37 Drawing Sheets

(56) References Cited

U.S. PATENT DOCUMENTS

| | | | |
|---|---|---|---|
| 2007/0096160 A1* | 5/2007 | Beroz | H01L 23/49838 |
| | | | 257/E23.036 |
| 2011/0285007 A1 | 11/2011 | Chi et al. | |
| 2016/0133601 A1 | 5/2016 | Ko et al. | |
| 2023/0133034 A1* | 5/2023 | Li | H03F 1/0288 |
| | | | 330/295 |

* cited by examiner

ELECTRONIC PACKAGE

BACKGROUND

1. Technical Field

The present disclosure relates generally to an electronic package and a method of manufacturing an electronic package.

2. Description of the Related Art

In order to reduce manufacturing costs as well as package size, GaN-based and/or GaAs-based amplifier circuits or components are usually stacked over a Si-based control circuit or component, and leadframes may be used as heat dissipation paths for the amplifier circuits or components. However, bond wires are required to electrically connect the control circuit or component and the leadframes, which can undesirably increase the device area or footprint of the package.

SUMMARY

In some embodiments, an electronic package includes an amplifier component, a control component, and a first circuit layer. The control component is disposed above the amplifier component. The first circuit layer is disposed between the amplifier component and the control component. The control component is configured to transmit a first signal to the amplifier component and to output a second signal amplified by the amplifier component.

In some embodiments, an electronic package includes a first circuit layer, an amplifier component, and a control component. The amplifier component is adjacent to the first circuit layer. The control component is adjacent to the first circuit layer and configured to transmit a first signal to the amplifier component and to output a second signal amplified by the amplifier component through the first circuit layer.

In some embodiments, an electronic package includes an amplifier component, a control component, and a connection component. The control component is disposed above the amplifier component. The connection component is disposed on the control component and adjacent to the amplifier component. The connection component includes a package body and a plurality of conductive elements. The conductive elements are encapsulated by the package body and spaced apart from the amplifier component.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
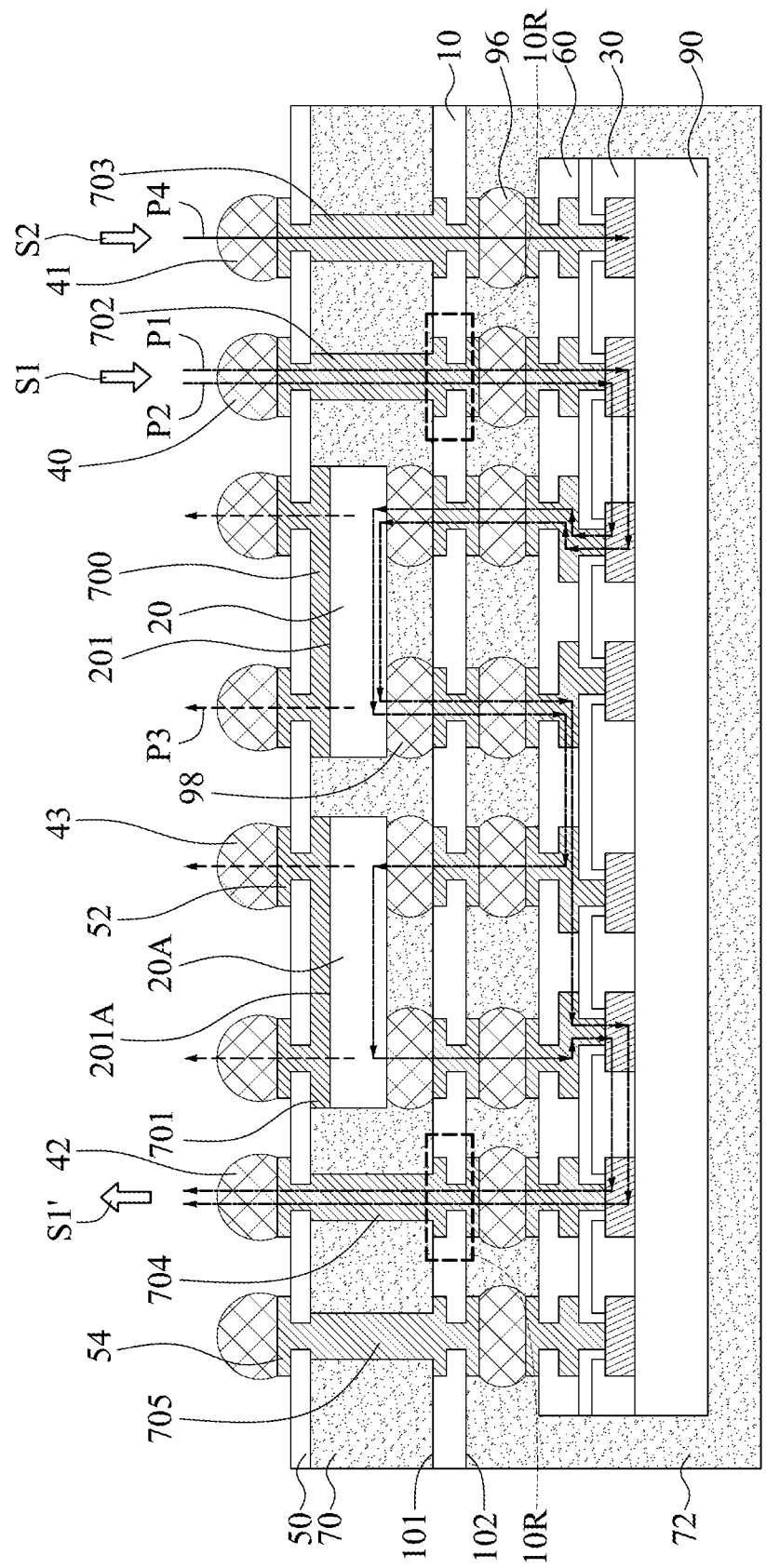
FIG. 1 is a schematic drawing of an electronic package in accordance with some embodiments of the present disclosure.

FIG. 1 is a schematic drawing of an electronic package 1 in accordance with some embodiments of the present disclosure. The electronic package 1 includes a circuit layers 10 and 50, amplifier components 20 and 20A, a control component 30, terminals 40, 41, 42, and 43, a redistribution layer (RDL) 60, elements 70 and 72, heat dissipation elements 700 and 701, conductive elements 702, 703, 704, and 705, and a substrate 90.

The circuit layer 10 may include, for example, a printed circuit board, such as a paper-based copper foil laminate, a composite copper foil laminate, or a polymer-impregnated glass-fiber-based copper foil laminate. In some embodiments, the circuit layer 10 includes a ceramic material or a metal plate. In some embodiments, the circuit layer 10 may include a substrate, such as an organic substrate or a leadframe. In some embodiments, the circuit layer 10 may include a two-layer substrate which includes a core layer and a conductive material and/or structure disposed on an upper surface and a bottom surface of the circuit layer 10. The circuit layer 10 may include an interconnection structure, such as a plurality of conductive traces and/or a plurality of conductive through vias. For example, the circuit layer 10 may be or include a RDL. The circuit layer 10 has a surface 101 and a surface 102 opposite to the surface 101. In some embodiments, the circuit layer 10 may include one or more conductive pads in proximity to, adjacent to, or embedded in and exposed by the surface 101 of the circuit layer 10. In some embodiments, the circuit layer 10 may include a solder resist on the surface 101 of the circuit layer 10 fully or partially exposing at least a portion of the conductive pads for electrical connections. In some embodiments, the circuit layer 10 may include one or more conductive pads in proximity to, adjacent to, or embedded in and exposed by the surface 102 of the circuit layer 10. In some embodiments, the circuit layer 10 may include a solder resist on the surface 102 of the circuit layer 10 fully or partially exposing at least a portion of the conductive pads for electrical connections. In some embodiments, the circuit layer 10 includes one or more conductive elements electrically connecting the conductive pads between the surface 101 and the surface 102. The conductive elements may be or include conductive through vias passing a core layer of the circuit layer 10.

In some embodiments, the circuit layer 10 is configured for providing impedance matching. In some embodiments, the circuit layer 10 includes one or more impedance matching circuits 10R configured for providing impedance matching. In some embodiments, the circuit layer 10 is or includes a RDL, and the impedance matching circuit 10R is a portion of the RDL and configured for providing impedance matching with respect to different signals (e.g., signals S1 and S1'). In some embodiments, the impedance matching circuit 10R is located at a signal transmission path P1 for transmitting a signal. In some embodiments, the impedance matching circuit 10R includes an inductance element, a resistive element, or a combination thereof.

The amplifier components 20 and 20A may be disposed adjacent to the circuit layer 10. In some embodiments, the amplifier components 20 and 20A are disposed on the surface 101 of the circuit layer 10. In some embodiments, the amplified circuits 20 and 20A may be bonded to the circuit layer 10 through conductive bumps 98. In some embodiments, the amplifier component 20 may be or include an amplifier circuit. In some embodiments, the amplifier components 20 and 20A may be semiconductor components including one or more group III-V semiconductor layers. For example, each of the amplifier components 20 and 20A may be or include a semiconductor component including a GaAs semiconductor layer, a GaN semiconductor layer, or a combination thereof. In some embodiments, the amplifier component 20 includes a GaAs-based amplifier component, and the amplifier component 20A includes a GaN-based amplifier component.

The control component 30 may be disposed adjacent to the circuit layer 10. In some embodiments, the control component 30 is disposed on the surface 102 of the circuit layer 10. In some embodiments, the control component 30 is disposed above the amplifier component 20. In some embodiments, the circuit layer 10 is disposed between the amplifier component 20 and the control component 30. In some embodiments, the amplifier components 20 and 20A and the control component 30 are disposed on opposite sides of the circuit layer 10. In some embodiments, the circuit layer 10 separates the control component 30 from the amplifier components 20 and 20A. In some embodiments, the control component 30 may be or include a control circuit. In some embodiments, the control component 30 may include a silicon-based control component. In some embodiments, the control component 30 may be formed on a silicon-based semiconductor component.

In some embodiments, the control component 30 is configured to transmit a signal (also referred to as "a first signal") to at least one of the amplifier components 20 and 20A and output a signal (also referred to as "a second signal") (e.g., the signal S1') amplified by at least one of the amplifier components 20 and 20A. In some embodiments, the control component 30 is configured to output a signal S1' (or the second signal) through the circuit layer 10. In some embodiments, the control component 30 is configured to transmit the signal (or the first signal) through a signal transmission path P1, which passes through the control component 30, the amplifier component 20 (or the amplifier component 20A), and the control component 30, sequentially, and the control component 30 is configured to output the amplified signal S1'. In some embodiments, the signal transmission path P1 passes through the control component 30, the amplifier component 20 (or the amplifier component 20A), and then the control component 30, sequentially. In some embodiments, the control component 30 is configured to transmit the signal (or the first signal) through a signal transmission path P2, which passes through the control component 30, the amplifier component 20, the amplifier component 20A, and the control component 30, sequentially, and the control component 30 is configured to output the amplified signal S1'. In some embodiments, the signal transmission path P2 passes through the control component 30, the amplifier component 20, the amplifier component 20A, and then the control component 30, sequentially. In some embodiments, the signals S1 and S1' include a power signal or an RF signal. In some embodiments, the impedance matching circuit 10R is configured for providing impedance matching with respect to the signal S1 and the signal S1'.

In some embodiments, the impedance matching circuit 10R (e.g., the impedance matching circuit 10R adjacent to the terminal 42) is configured to receive a signal (also referred to as "a third signal") from the control component 30 and to generate the signal S1' (also referred to as "a second signal"). In some embodiments, the signal (or the third signal) is amplified by the amplified circuit 20. In some embodiments, the impedance matching circuit 10R (e.g., the impedance matching circuit 10R adjacent to the terminal 40) is configured to receive a signal S1 (also referred to as "a fourth signal") and to generate the signal (or the first signal) transmitted to the amplifier component 20 by the control component 30.

In some embodiments, an input/output (I/O) path P4 is configured to transmit a signal S2 to the control component 30, and the signal S2 is different from the signal S1. In some embodiments, the signal S2 is transmitted through the I/O path P4 passing through the circuit layer 10 and the control component 30, sequentially. In some embodiments, the I/O path P4 is configured to transmit the signal S2 through the circuit layer 10 and the control component 30, sequentially. In some embodiments, the signal S2 includes a control signal. In some embodiments, the signal S1 may be amplified by the amplifier components 20 and/or 20A according the signal S2.

The terminals 40 and 42 may be I/O terminals. In some embodiments, the terminal 40 may be an input terminal, and the terminal 42 may be an output terminal. In some embodiments, the terminals 40 and 42 are disposed closer to the amplifier component 20 than the control component 30 and are electrically connected to the control component 30 through the circuit layer 10. In some embodiments, the terminal 40 (or the input terminal) and the circuit layer 10 are configured to provide a signal transmission path across the amplifier component 20 (also referred to as "a first signal transmission path"). In some embodiments, the terminal 42 (or the output terminal) and the circuit layer 10 are configured to provide a signal transmission path across the amplifier component 20 (also referred to as "a second signal transmission path"). In some embodiments, the signal S1 is input from the input terminal 40, and the signal S1' is output from the output terminal 42. In some embodiments, the input terminal 40 and the output terminal 42 are disposed within a projection of the control component 30. For example, the input terminal 40 and the output terminal 42 are disposed within a projection of the control component 30 on the surface 101. In some embodiments, a projection of the input terminal 40 on the substrate 90 and a projection of the output terminal 42 on the substrate 90 are within a projection of the control component 30 on the substrate 90. In some embodiments, the impedance matching circuit 10R is located at the signal transmission path P1 between the input terminal 40 and the control component 30 (or the first signal transmission path). In some embodiments, the impedance matching circuit 10R is located at the signal transmission path P1 between the output terminal 42 and the control component 30 (or the second signal transmission path).

The terminal 41 may be an I/O terminal. In some embodiments, the terminal 41 is an input terminal. In some embodiments, the input terminal 41 is disposed within a projection of the control component 30. In some embodiments, a projection of the input terminal 41 on the substrate 90 is within a projection of the control component 30 on the substrate 90. In some embodiments, the signal S2 is input from the input terminal 41 and transmitted to the control component 30.

The terminals 43 may be configured for heat dissipation. In some embodiments, the terminals 43 are disposed on an inactive surface (or passive surface) 201 of the amplifier component 20. In some embodiments, the terminals 43 are disposed on an inactive surface 201A of the amplifier component 20A. In some embodiments, the terminal 40 and 41 (or the I/O terminals) are disposed adjacent to the terminals 43.

The circuit layer 50 may be disposed on the inactive surface 201 of the amplifier component 20. The circuit layer 50 may be further disposed on the inactive surface 201A of the amplifier component 20A. In some embodiments, the circuit layer 50 is configured to define the signal transmission path P1 or P2. In some embodiments, the circuit layer 50 is configured to define a heat dissipation path P3 for the amplifier components 20 and 20A. In some embodiments, the circuit layer 50 includes the terminals 40 and 42 and is configured to provide a heat dissipation path P3 for the amplifier components 20 and 20A. In some embodiments, the circuit layer 50 is configured to define the I/O path P4 passing the circuit layer 10. In some embodiments, the circuit layer 50 is configured to define the I/O path P4 for the control component 30. In some embodiments, the circuit layer 50 defines a plurality of thermal pads 52 and a plurality of conductive pads 54. In some embodiments, the circuit layer 50 includes a plurality of thermal pads 52 and a plurality of conductive pads 54.

In some embodiments, the inactive surface 201 of the amplifier component 20 is configured to provide the heat dissipation path P3. In some embodiments, the inactive surface 201A of the amplifier component 20A is configured to provide the heat dissipation path P3. In some embodiments, the heat dissipation path P3 is adjacent to the input terminal 40 and the output terminal 42. In some embodiments, the inactive surface 201 of the amplifier component 20 and the inactive surface 201A of the amplifier component 20A are configured to provide a plurality of heat dissipation paths P3. In some embodiments, the heat dissipation paths P3 are defined by a plurality of thermal pads 52 over the amplifier component 20. In some embodiments, the heat dissipation paths P3 are defined by a plurality of thermal pads 52 on the inactive surface 201 of the amplifier component 20 and the inactive surface 201A of the amplifier component 20A. In some embodiments, the heat dissipation paths P3 include the thermal pads 52. In some embodiments, the input terminal 40 and the output terminal 42 are adjacent to the thermal pads 52. In some embodiments, the terminals 43 are connected to the thermal pads 52 of the circuit layer 50.

In some embodiments, the circuit layer 50 includes the terminals 40, 41, 42, and 43. In some embodiments, the terminals 40, 41, and 42 are electrically connected to the conductive pads 54 of the circuit layer 50. In some embodiments, the terminals 40, 41, 42, and 43 may be or include gold (Au), silver (Ag), copper (Cu), another metal, a solder alloy, or a combination of two or more thereof. In some embodiments, the terminals 40, 41, 42, and 43 may include a controlled collapse chip connection (C4) bump, a ball grid array (BGA) or a land grid array (LGA).

The RDL 60 may be between the amplifier component 20 and the control component 30. In some embodiments, the signal S1 is transmitted to the control component 30 through the RDL 60. In some embodiments, the signal S2 is transmitted to the control component 30 through the RDL 60. In some embodiments, the RDL 60 is electrically connected to the circuit layer 10 through a plurality of conductive bumps 96.

The element 70 (also referred to as "the protective element") may be configured to protect the amplifier components 20 and 20A. In some embodiments, the element 70 is on the surface 101 of the circuit layer 10. In some embodiments, the element 70 is between the circuit layer 50 and the circuit layer 10. In some embodiments, the element 70 may be or include an encapsulant. The encapsulant may include an epoxy resin having fillers, a molding compound (e.g., an epoxy molding compound or other molding compound), polyimide, a phenolic compound or material, a material with silicone dispersed therein, or a combination thereof.

The element 72 (also referred to as "the protective element") may be configured to protect the control component 30. In some embodiments, the element 72 is on the surface 102 of the circuit layer 10. In some embodiments, a portion of the element 72 is between the RDL 60 and the circuit layer 10. In some embodiments, the circuit layer 10 separates the element 70 from the element 72. In some embodiments, the element 72 further covers or encapsulates the substrate 90. In some embodiments, the element 72 may be or include an encapsulant. The encapsulant may include an epoxy resin having fillers, a molding compound (e.g., an epoxy molding compound or other molding compound), polyimide, a phenolic compound or material, a material with silicone dispersed therein, or a combination thereof.

The heat dissipation element 700 may be disposed between the inactive surface 201 of the amplifier component 20 and the circuit layer 50. The heat dissipation element 701 may be disposed between the inactive surface 201A of the amplifier component 20A and the circuit layer 50. In some embodiments, the heat dissipation elements 700 and 701 include metal layers or metal plates.

The conductive elements 702, 703, 704, and 705 may be covered or encapsulated by the element 70. In some embodiments, the conductive element 702 electrically connects the input terminal 40 to the circuit layer 10. In some embodiments, the conductive element 703 electrically connects the input terminal 41 to the circuit layer 10. In some embodiments, the conductive element 704 electrically connects the circuit layer 10 to the output terminal 42. In some embodiments, the conductive elements 702, 703, 704, and 705 may be or include conductive pillars.

The substrate 90 may include, for example, a printed circuit board, such as a paper-based copper foil laminate, a composite copper foil laminate, or a polymer-impregnated glass-fiber-based copper foil laminate. The substrate 90 may include an interconnection structure, such as a plurality of conductive traces and/or a plurality of conductive through vias. In some embodiments, the substrate 90 may include a ceramic material or a metal plate. In some embodiments, the substrate 90 may include an organic substrate or a leadframe. In some embodiments, the substrate 90 may include a two-layer substrate which includes a core layer and a conductive material and/or structure disposed on an upper surface and a bottom surface of the substrate 90. The material for the substrate 90 may include bulk silicon, a semiconductor wafer, a silicon-on-insulator (SOI) substrate, or a silicon germanium substrate. In some embodiments, the substrate 90 may be or include a multi-layered substrate such as a SOI substrate, which includes a bottom semiconductor layer, a buried oxide layer (BOX), and a top semiconductor layer. In some embodiments, the substrate 90 may include a silicon-based semiconductor component. In some embodiments, the substrate 92 may include one or more active chips including a low noise amplifier (LNA), a switch, a controller, a mobile industry processor interface (MIPI), or a combination thereof. In some embodiments, the substrate 92 may include one or more passive chips including a band pass filter (BPF), a balun band pass filter (BPB), a diplexer (DPX), or a combination thereof.

Currently, amplifier components (e.g., GaN-based and/or GaAs-based amplifier components) may be stacked with a control component (e.g., a Si-based control component) over a leadframe in order to reduce the package size (e.g., the device area on an x-y plane). As a result, the electrical connection between the control component and the leadframe usually requires bond wires. However, the bond wires may significantly increase the device area (e.g., on an x-y plane) since the bond wires extend from the control component outwards to the leads that are arranged outside of the control component. In contrast, according to some embodiments of the present disclosure, input terminals and output terminals connected to the control component are within the projection of the control component, rather than extending out of the projection of the control component. Therefore, the device area (e.g., on an x-y plane) can be significantly reduced, and thus the entire package size can be reduced accordingly.

In addition, according to some embodiments of the present disclosure, the carrier (e.g., the circuit layer 10) includes a circuit element configured for providing impedance matching with respect to different RF signals or power signals (e.g., an input signal and an output amplified signal). Compared to forming a impedance matching circuit element on the substrate (e.g., the substrate 90) adjacent to the control component, the distance between the impedance matching circuit element and an adjacent conductive layer or metal layer can be increased (e.g., the distance between the circuit layer 50 and the impedance matching circuit 10R is relatively large), and thus the Q value can be increased, thereby the impedance matching performance can be improved.

Moreover, in some cases where one thermal pad (or one heat dissipation pad) having a relatively large area is disposed adjacent to the amplifier components, the solder ball connecting to the relatively large thermal pad may have a relatively large volume and thus increased thickness after undergoing reflowing. The increased thickness of the solder ball may generate an uneven or non-uniform distance between the electronic package and an adjacent layer or structure (e.g., an external PCB) and thus cause delamination. In contrast, according to some embodiments of the present disclosure, the heat dissipation paths are defined by a plurality of thermal pads on the inactive surfaces of the amplifier components. Since the sizes of the thermal pads are close to the sizes of the conductive pads adjacent to the thermal pads, the solder balls that connect to the thermal pads and the conductive pads have substantially the same or similar volumes. Therefore, the thicknesses of the solder balls connected to the thermal pads and the conductive pads can be substantially the same or similar after undergoing reflowing, and thus the distance between the electronic package and an adjacent layer or structure (e.g., an external PCB) can be relatively uniform. Therefore, delamination can be prevented.

Figure 2:
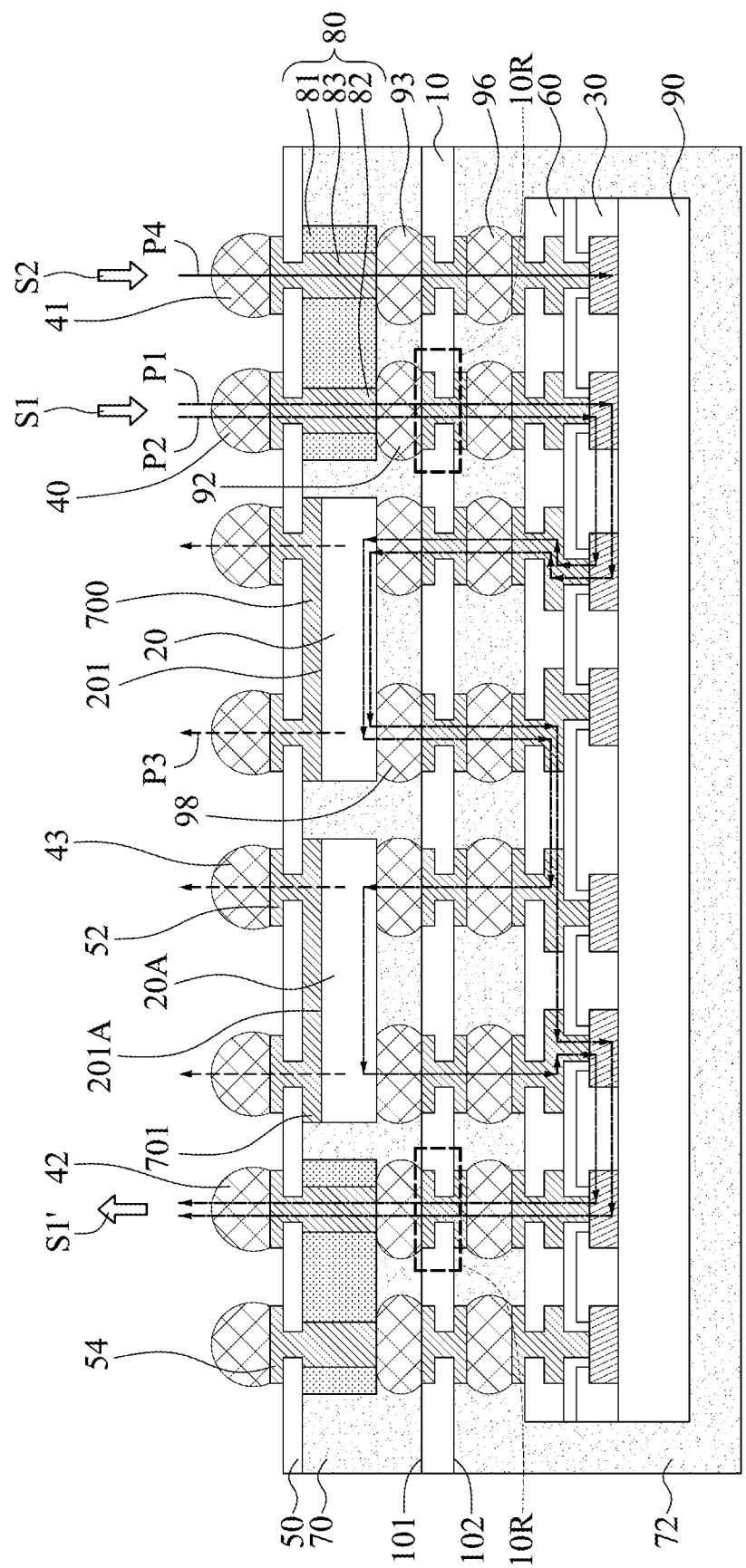
FIG. 2 is a cross-section of an electronic package in accordance with some embodiments of the present disclosure.

FIG. 2 is a cross-section of an electronic package 2 in accordance with some embodiments of the present disclosure. The electronic package 2 is similar to the electronic module 1 in FIG. 1, differing therefrom as follows. Descriptions of similar components are omitted.

In some embodiments, the electronic package 2 further includes one or more connection components 80 and a plurality of conductive bumps (e.g., conductive bumps 92 and 93) connected to the connection component(s) 80.

In some embodiments, the connection component 80 is disposed on the control component 30 and adjacent to the amplifier components 20 and 20A. In some embodiments, the connection component 80 is electrically connected to the control component 30. In some embodiments, the connection component 80 is between the circuit layer 10 and the circuit layer 50. In some embodiments, the connection component 80 directly or physically contacts the circuit layer 50. In some embodiments, the conductive pads 54 of the circuit layer 50 are disposed on the connection component 80. In some embodiments, the input terminal 40 and the input terminal 41 are disposed adjacent to the terminals 43 and electrically connect to the connection component 80.

In some embodiments, the connection component 80 includes a package body 81 and a plurality of conductive elements (e.g., conductive elements 82 and 83). In some embodiments, the conductive elements 82 and 83 are encapsulated by the package body 81. In some embodiments, the conductive elements 82 and 83 are spaced apart from the amplifier component 20. In some embodiments, the conductive elements 82 and 83 include conductive pillars passing through the package body 81. In some embodiments, the package body 81 may be or include an encapsulant. The encapsulant may include an epoxy resin having fillers, a molding compound (e.g., an epoxy molding compound or other molding compound), polyimide, a phenolic compound or material, a material with silicone dispersed therein, or a combination thereof.

In some embodiments, the conductive bump 92 electrically connects the conductive element 82 to the circuit layer 10. In some embodiments, the conductive bump 93 electrically connects the conductive element 83 to the circuit layer 10. In some embodiments, the conductive bumps 92 and 93 directly or physically contact the package body 81. In some embodiments, the conductive elements 82 and 83 of the connection component 80 electrically connect the circuit layer 10 and the conductive pads 54 of the circuit layer 50. In some embodiments, the input terminal 40 and the input terminal 41 are configured to transmit different signals (i.e., the signal S1 and the signal S2) and respectively electrically connected to the conductive element 82 and the conductive element 83 of the connection component 80. In some embodiments, the circuit layer 50 is electrically connected to the control component 30 through the conductive elements 82 and 83, the circuit layer 10, the conductive bumps 92 and 93, and the RDL 60.

In some embodiments, the element 70 covers or encapsulates the amplifier components 20 and 20A and the connection components 80. In some embodiments, the conductive bumps 92 and 93 are in contact with the package body 81 and the element 70. In some embodiments, the package body 81 is spaced apart from the amplifier components 20 and 20A by the element 70. In some embodiments, the package body 81 and the element 70 may include the same or different materials.

According to some embodiments of the present disclosure, pre-formed connection components 80 are adopted for electrical connection between the I/O terminals (e.g., the terminals 40, 41, and 42) and the carrier (e.g., the circuit layer 10). Since the connection components 80 can be of various predetermined designs according to the actual applications, e.g., having a predetermined size, shape, number of conductive elements therein, etc., the connection components 80 can be compatible with various manufacturing processes or nodes.

In addition, according to some embodiments of the present disclosure, the connection components can be preformed and then incorporated into the electronic package. Since the connection components and the intermediate structure including the carrier, the control component, and the substrate are formed separately, the loss of known-good-products can be reduced, and thus the yield of the electronic package 2 can be increased. Moreover, the manufacturing costs can be reduced as well.

Figure 2A:
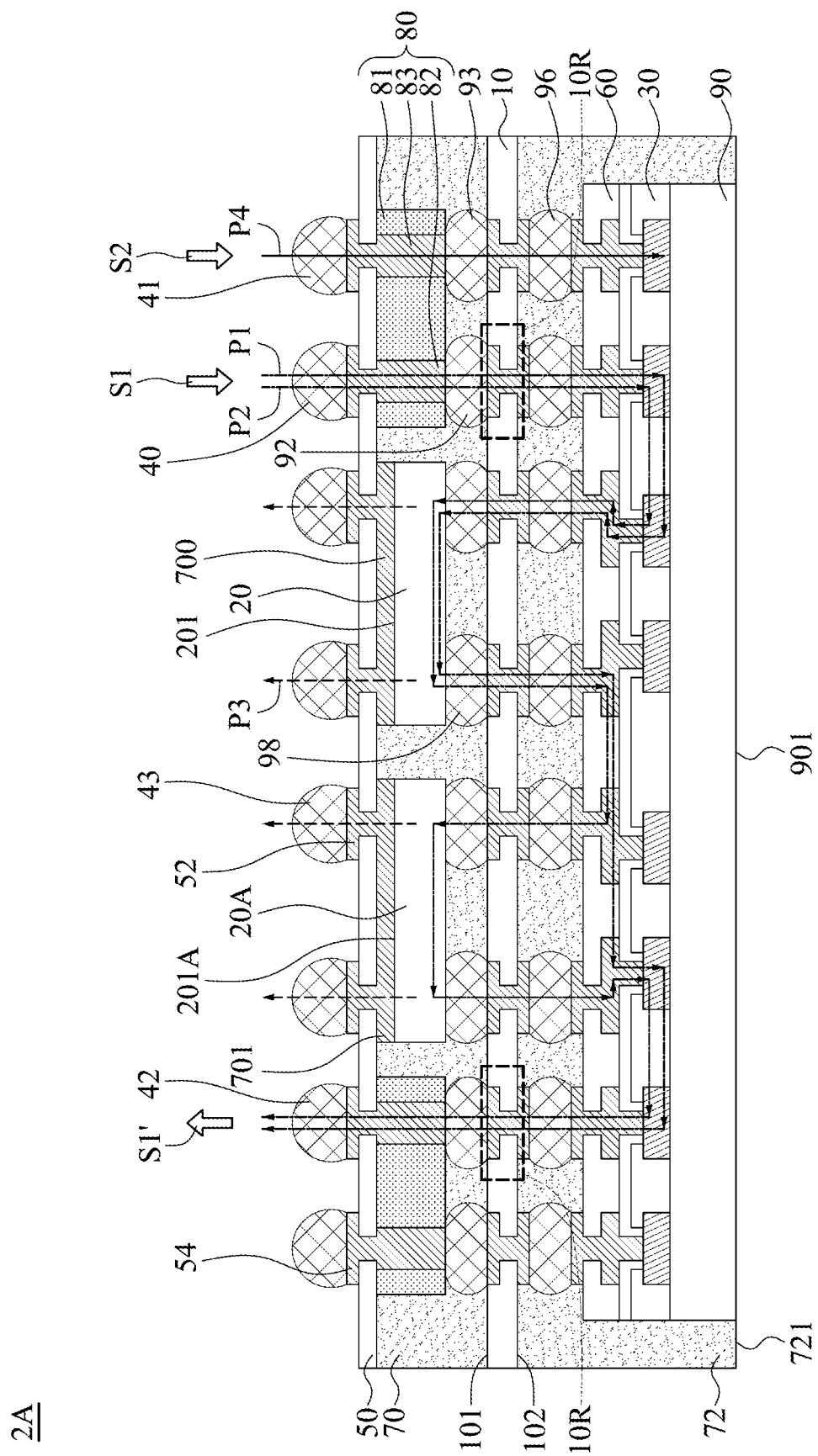
FIG. 2A is a cross-section of an electronic package in accordance with some embodiments of the present disclosure.

FIG. 2A is a cross-section of an electronic package 2A in accordance with some embodiments of the present disclosure. The electronic package 2A is similar to the electronic module 2 in FIG. 2, differing therefrom as follows. Descriptions of similar components are omitted.

In some embodiments, a surface 901 (also referred to as "a bottom surface") of the substrate 90 is exposed by the element 72. In some embodiments, the surface 901 of the substrate 90 is substantially coplanar with or aligned to a surface 721 (also referred to as "a bottom surface") of the element 72. Therefore, the heat dissipation of the substrate 90 and the control component 30 can be improved.

Figure 3:
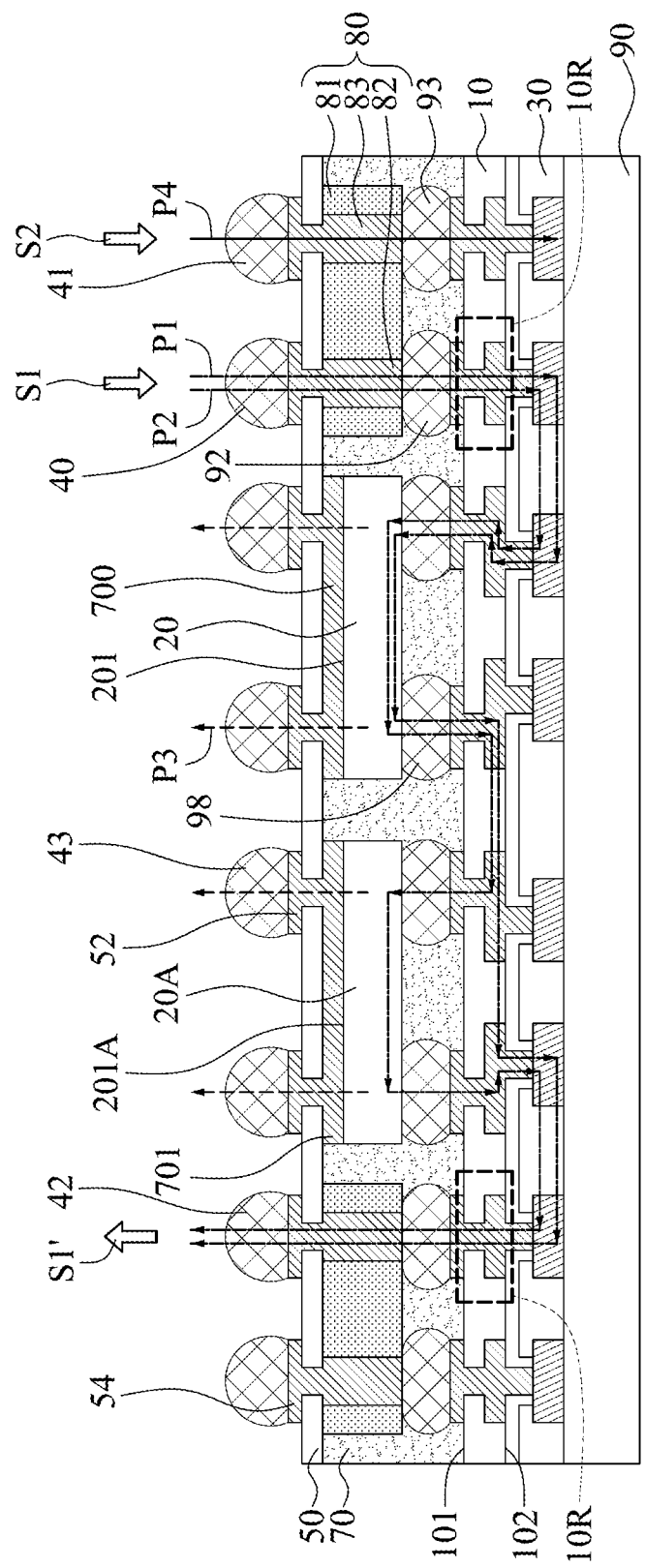
FIG. 3 is a cross-section of an electronic package in accordance with some embodiments of the present disclosure.

FIG. 3 is a cross-section of an electronic package 3 in accordance with some embodiments of the present disclosure. The electronic package 3 is similar to the electronic module 2 in FIG. 2, differing therefrom as follows. Descriptions of similar components are omitted.

In some embodiments, the electronic package 3 does not include an RDL and a plurality of conductive bumps between the circuit layer 10 and the control component 30. In some embodiments, the electronic package 3 does not include an element encapsulating the control component 30 and the substrate 90. In some embodiments, the circuit layer 10 contacts the control component 30. In some embodiments, the conductive pads or conductive traces of the circuit layer 10 directly or physically contact the control component 30.

Figure 4:
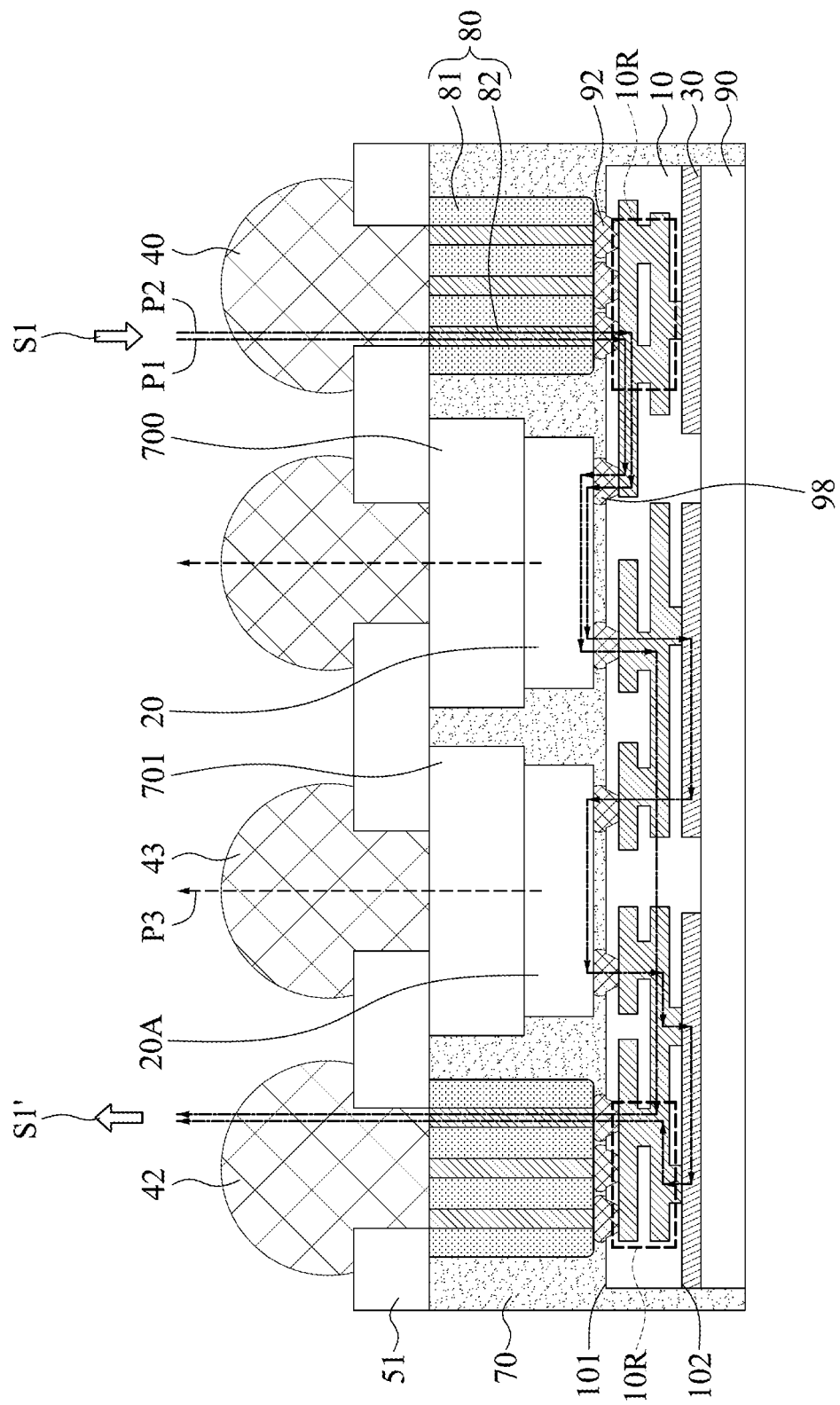
FIG. 4 is a cross-section of an electronic package in accordance with some embodiments of the present disclosure.

FIG. 4 is a cross-section of an electronic package 4 in accordance with some embodiments of the present disclosure. The electronic package 4 is similar to the electronic module 3 in FIG. 3, differing therefrom as follows. Descriptions of similar components are omitted.

In some embodiments, the electronic package 4 includes a circuit layer 51 on the package body 81 and the protective element 70. In some embodiments, the circuit layer 51 electrically connects to the circuit layer 10 through the conductive elements 82. In some embodiments, the circuit layer 51 includes an insulating layer defining a plurality of openings for disposing or accommodating the terminals 40, 42, and 43. In some embodiments, the conductive elements 82 of the connection component 80 electrically connect the input terminal 40 (or the I/O terminal) to the control component 30. In some embodiments, the input terminal 40 connects to the conductive elements 82 through the openings of the insulating layer of the circuit layer 51. In some embodiments, the terminals 43 connect to the heat dissipation elements 700 and 701 through the openings of the insulating layer of the circuit layer 51. In some embodiments, the heat dissipation elements 700 and 701 include metal layers or metal plates. In some embodiments, the heat dissipation elements 700 and 701 include portions of a leadframe.

The circuit layer 10 may be a RDL including one to four layers of conductive traces or conductive pads and one to four layers of insulating material. The layers of conductive traces or conductive pads may be from about 3 μm to about 10 μm. The layers of insulating material may be from about 5 μm to about 14 μm.

Figure 5:
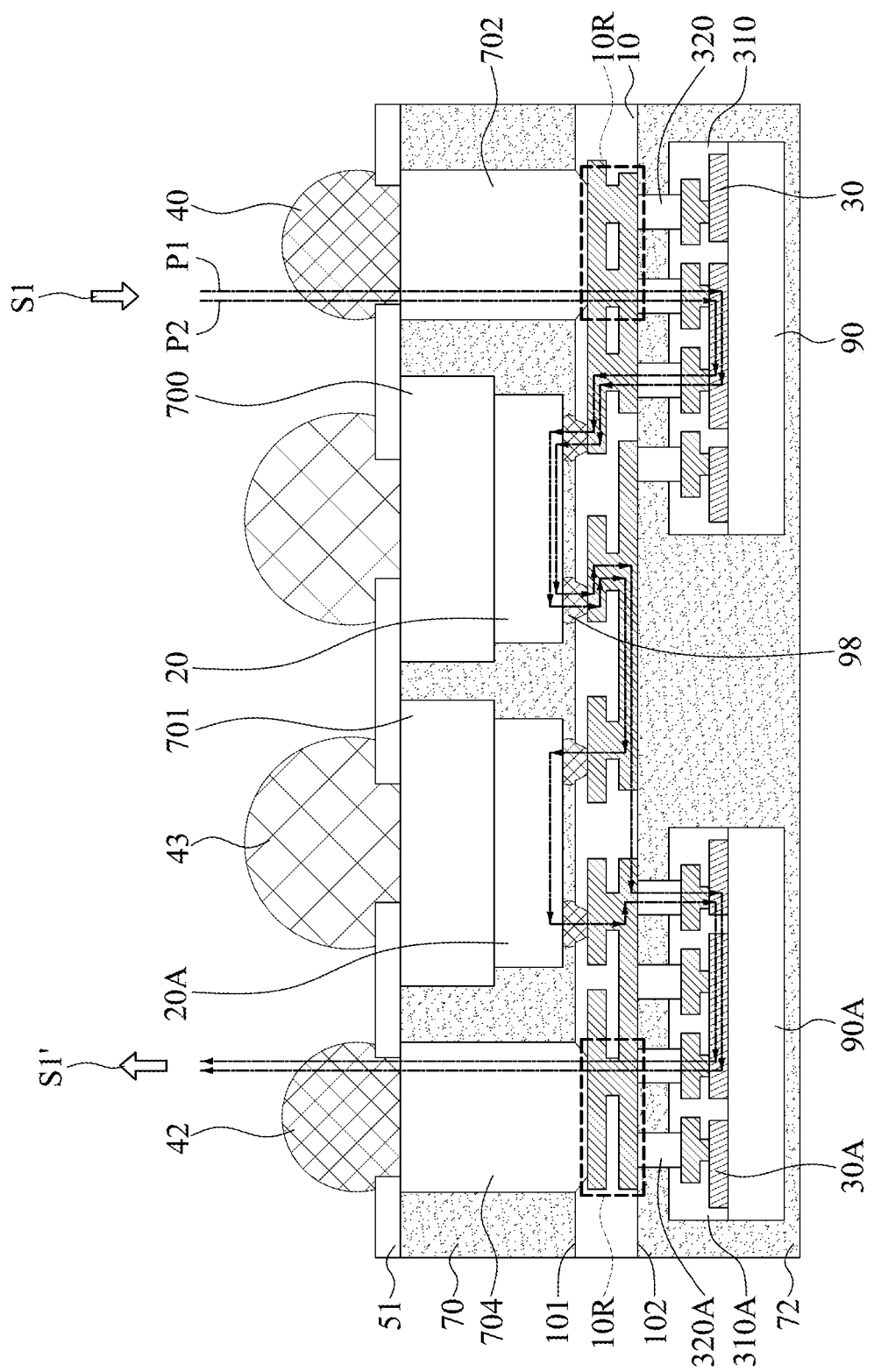
FIG. 5 is a cross-section of an electronic package in accordance with some embodiments of the present disclosure.

FIG. 5 is a cross-section of an electronic package 5 in accordance with some embodiments of the present disclosure. The electronic package 5 is similar to the electronic module 1 in FIG. 1, differing therefrom as follows. Descriptions of similar components are omitted.

In some embodiments, the electronic package 5 includes substrates 90 and 90A, control components 30 and 30A, and conductive elements 320 and 320A. In some embodiments, the RDL 310 is on the control component 30, and the conductive elements 320 electrically connect the conductive traces or conductive pads of the circuit layer 10 to the control component 30 through the RDL 310. In some embodiments, the RDL 310A is on the control component 30A, and the conductive elements 320A electrically connect the conductive traces or conductive pads of the circuit layer 10 to the control component 30A through the RDL 310A. In some embodiments, the control component 30 is configured to transmit a signal (or first signal) through a signal transmission path P1, which passes through the control component 30, the amplifier component 20 (or the amplifier component 20A), and the control component 30A, sequentially, and output the amplified signal S In some embodiments, the control component 30 is configured to transmit the signal (or the first signal) through a signal transmission path P2, which passes through the control component 30, the amplifier component 20, the amplifier component 20A, and the control component 30A, sequentially, and output the amplified signal S1'.

In some embodiments, the electronic package 5 does not include a plurality of conductive bumps between the circuit layer 10 and the control component 30. In some embodiments, the element 72 covers or encapsulates the substrates 90 and 90A, the control components 30 and 30A, and the conductive elements 320 and 320A. In some embodiments, the heat dissipation elements 700 and 701 include metal layers or metal plates. In some embodiments, the heat dissipation elements 700 and 701 include portions of a leadframe.

FIG. 6A, FIG. 6B, FIG. 6C, FIG. 6D, FIG. 6E, FIG. 6F, FIG. 6G, FIG. 6H, FIG. 6I illustrate various stages of a method of manufacturing an electronic package 1 in accordance with some embodiments of the present disclosure.

Figure 6A:
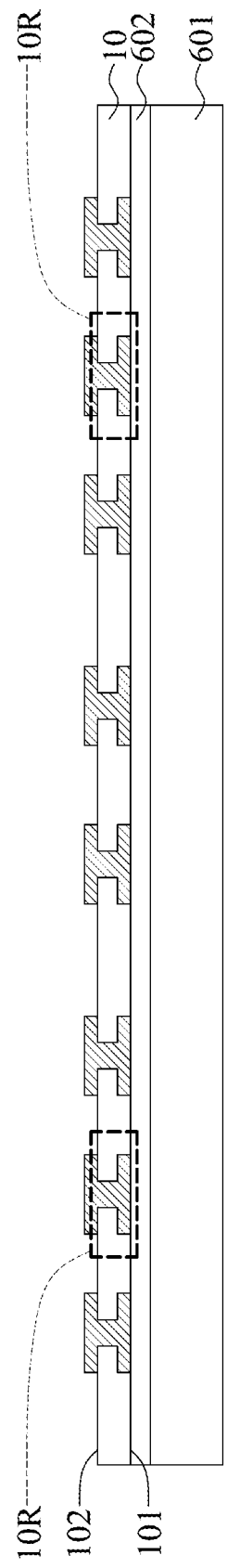
FIG. 6A, FIG. 6B, FIG. 6C, FIG. 6D, FIG. 6E, FIG. 6F, FIG. 6G, FIG. 6H, FIG. 6I illustrate various stages of a method of manufacturing an electronic package in accordance with some embodiments of the present disclosure.

Referring to FIG. 6A, a carrier 601 may be provided, a buffer layer 602 may be formed on the carrier 601, and a circuit layer 10 may be formed on the buffer layer 602. The circuit layer 10 may be a RDL including two layers of conductive traces or conductive pads and one layer of insulating material. The circuit layer 10 may include a impedance matching circuit 10R configured for impedance matching. The carrier 601 may be a 12-inch semiconductor wafer. The buffer layer 602 may be a release film or an adhesive layer.

Figure 6B:
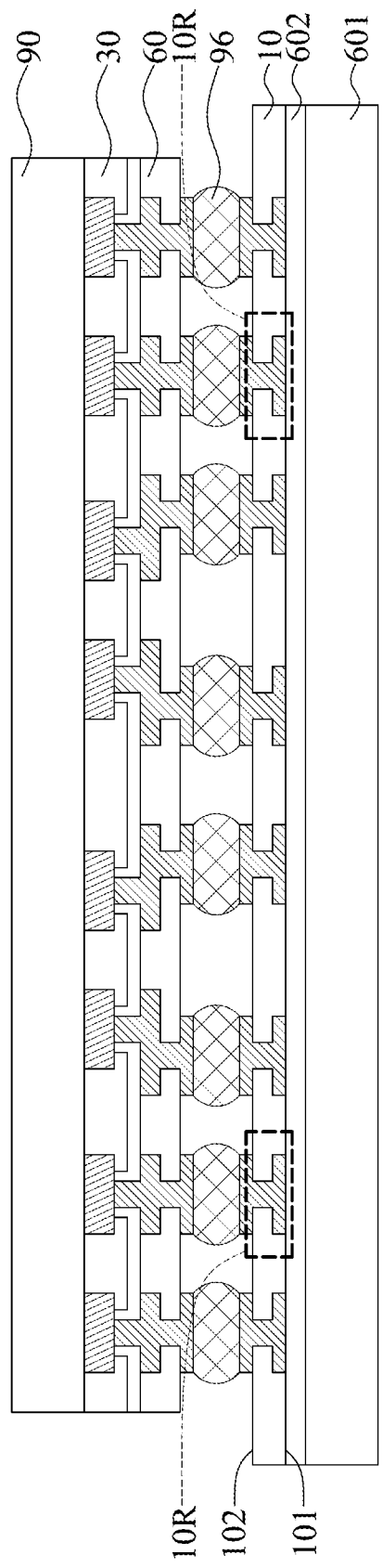

Referring to FIG. 6B, a substrate 90 having a control component 30 formed thereon and an RDL 60 formed on the control component 30 may be bonded to the circuit layer 10 through a plurality of conductive bumps 96.

Figure 6C:
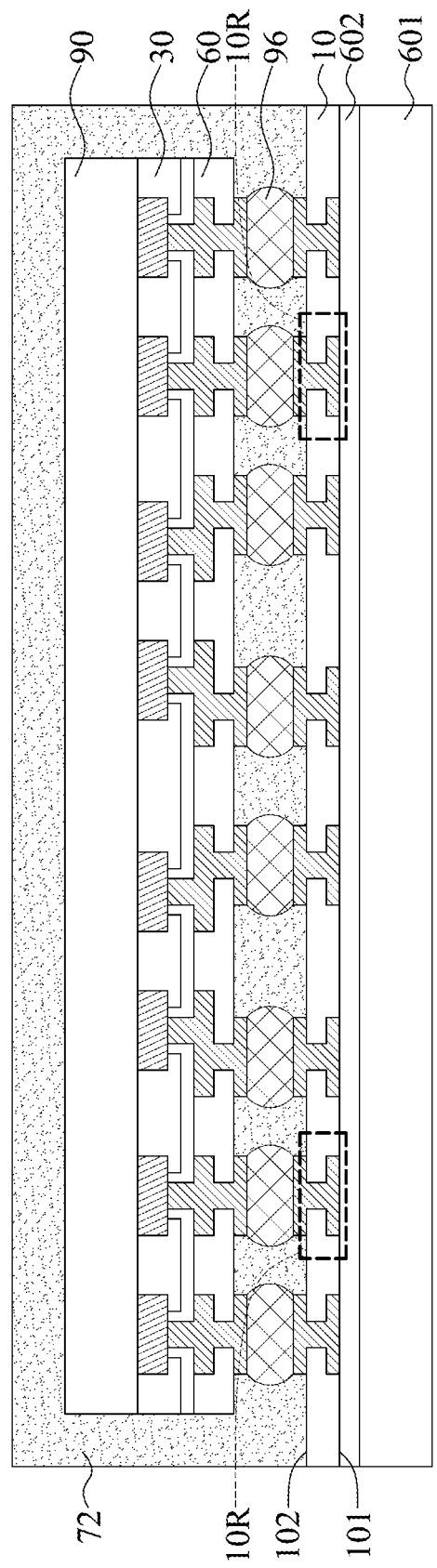

Referring to FIG. 6C, the substrate 90, the control component 30, the RDL 60, and the conductive bumps 96 may be covered or encapsulated by an element 72. The element 72 may include an encapsulant.

Figure 6D:
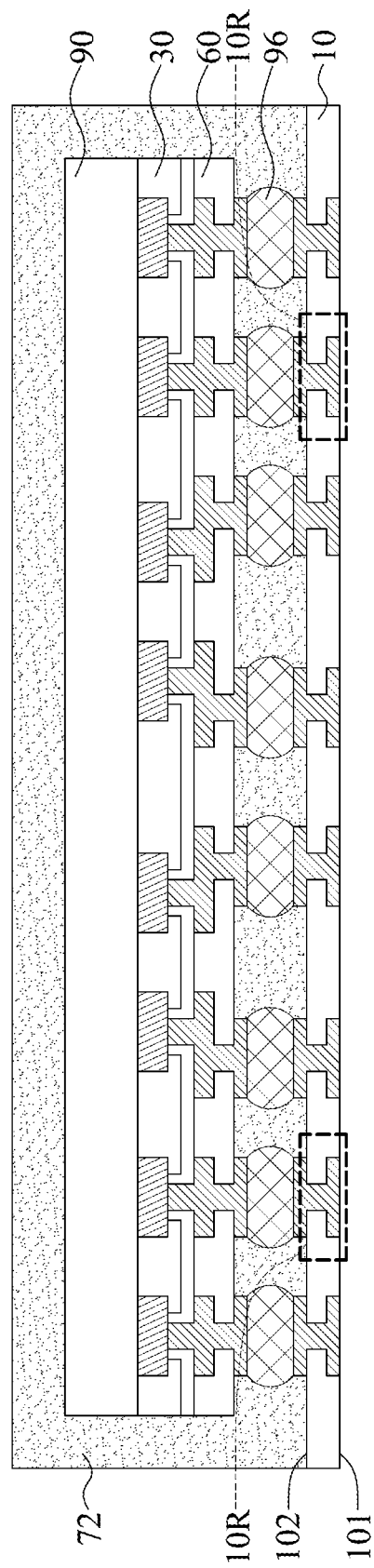

Referring to FIG. 6D, the carrier 601 and the buffer layer 602 may be removed.

Figure 6E:
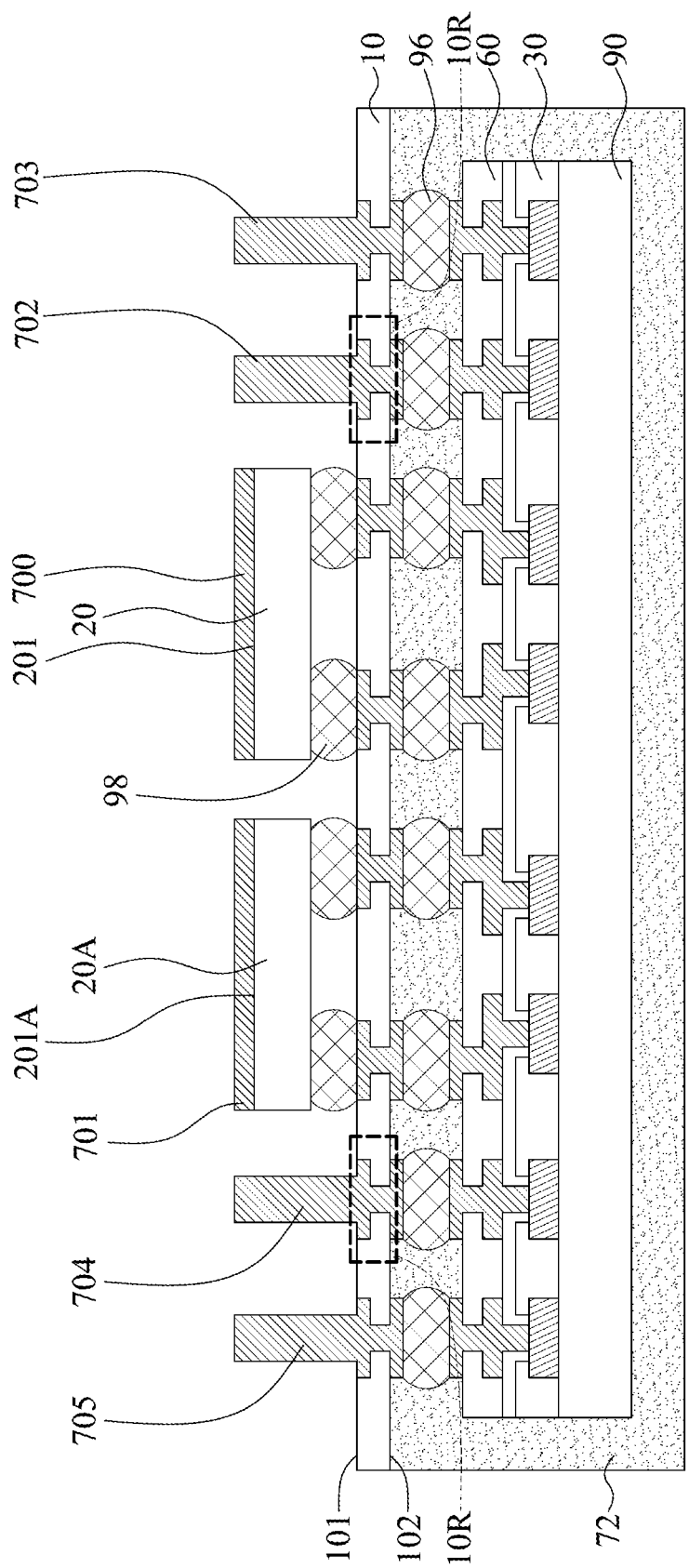

Referring to FIG. 6E, the structure illustrated in FIG. 6D is flipped by about 180°, amplified circuits 20 and 20A may be bonded to the circuit layer 10 through conductive bumps 98, and conductive elements 702, 703, 704, and 705 may be formed on the circuit layer 10. In some embodiments, the conductive elements 702, 703, 704, and 705 are formed by plating. In some embodiments, heat dissipation elements 700 and 701 may be formed on the amplified circuits 20 and 20A prior to or after the amplified circuits 20 and 20A are bonded to the circuit layer 10. The heat dissipation elements 700 and 701 may include metal layers or metal plates formed by, for example, plating.

Figure 6F:
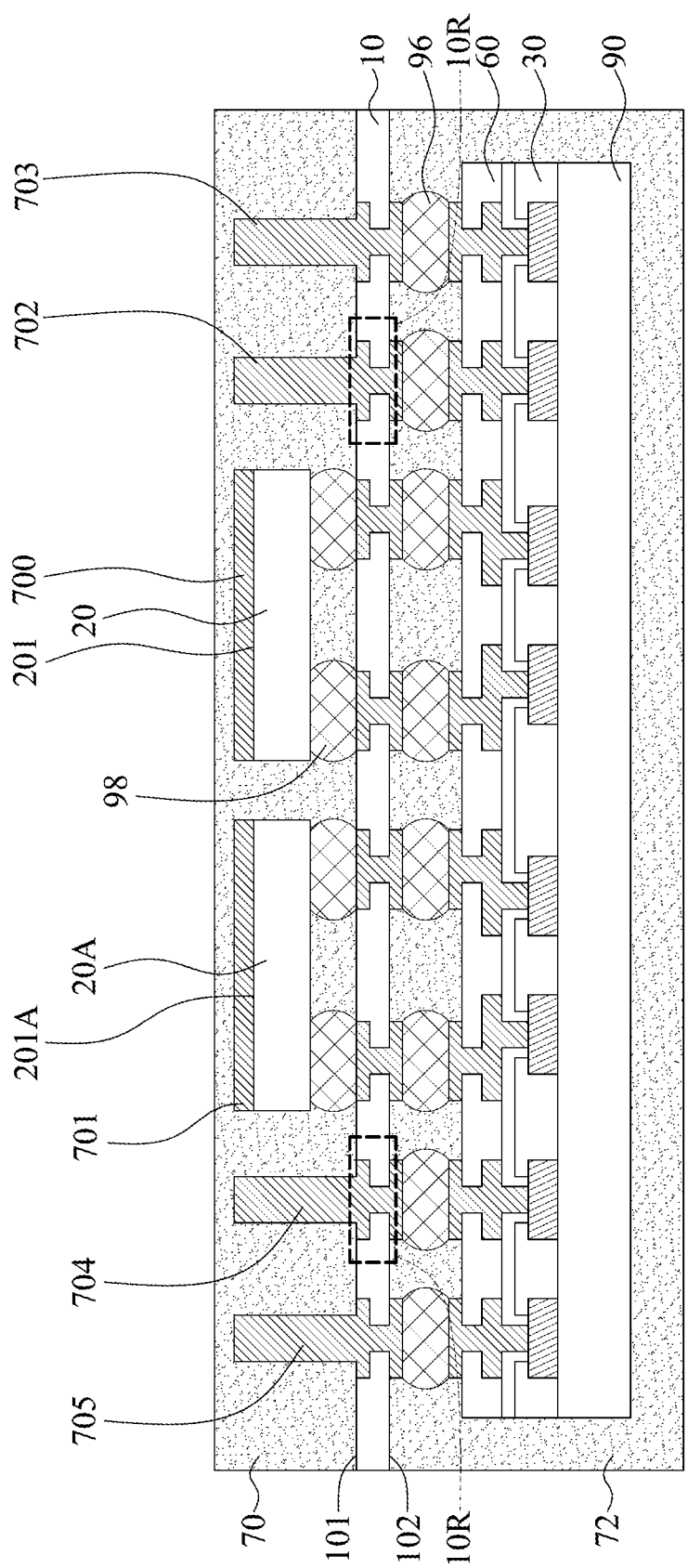

Referring to FIG. 6F, the amplified circuits 20 and 20A, the heat dissipation elements 700 and 701, the conductive bumps 98, and the conductive elements 702, 703, 704, and 705 may be covered or encapsulated by an element 70. The element 70 may include an encapsulant.

Figure 6G:
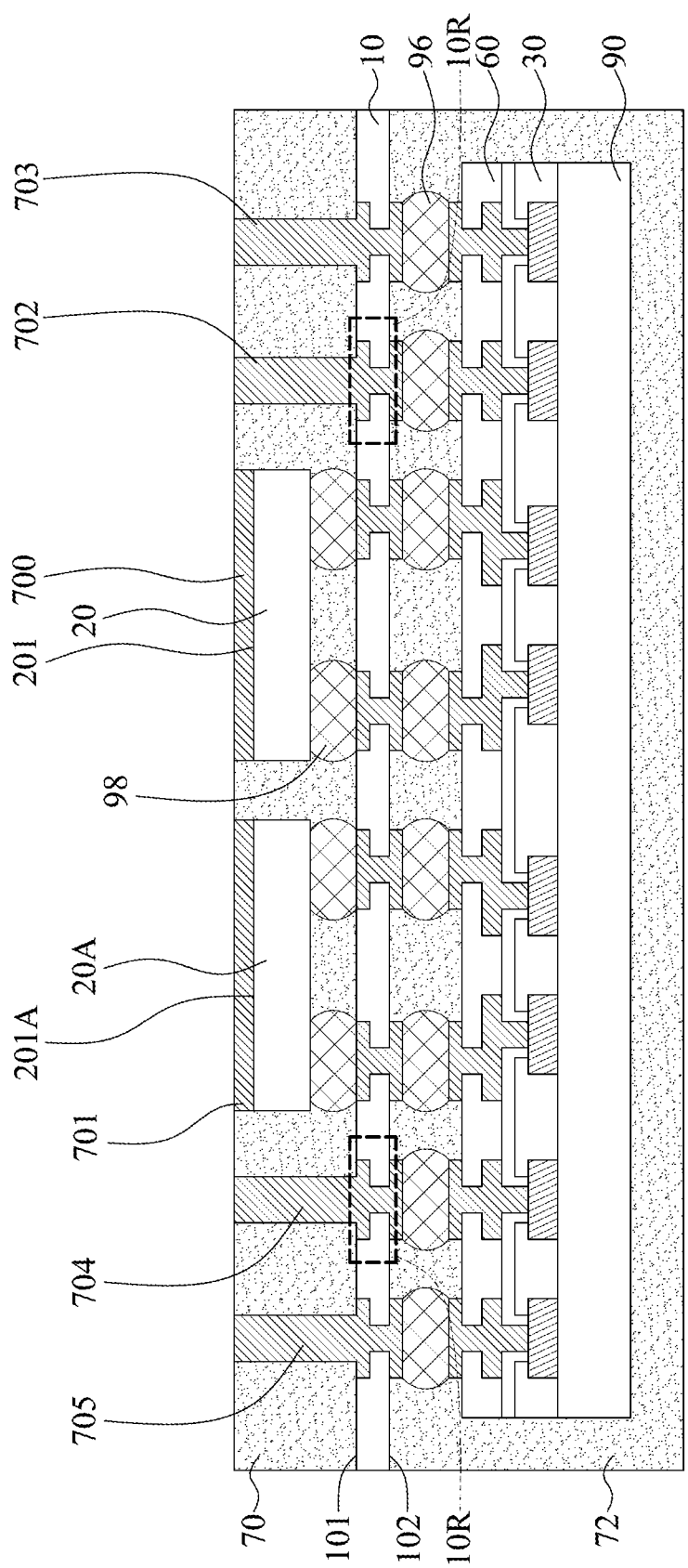

Referring to FIG. 6G, a grinding operation may be performed on the element 70. In some embodiments, the element 70, the heat dissipation elements 700 and 701, and the conductive elements 702, 703, 704, and 705 may be partially removed by the grinding operation to expose upper surfaces of the heat dissipation elements 700 and 701 and upper surfaces of the conductive elements 702, 703, 704, and 705.

Figure 6H:
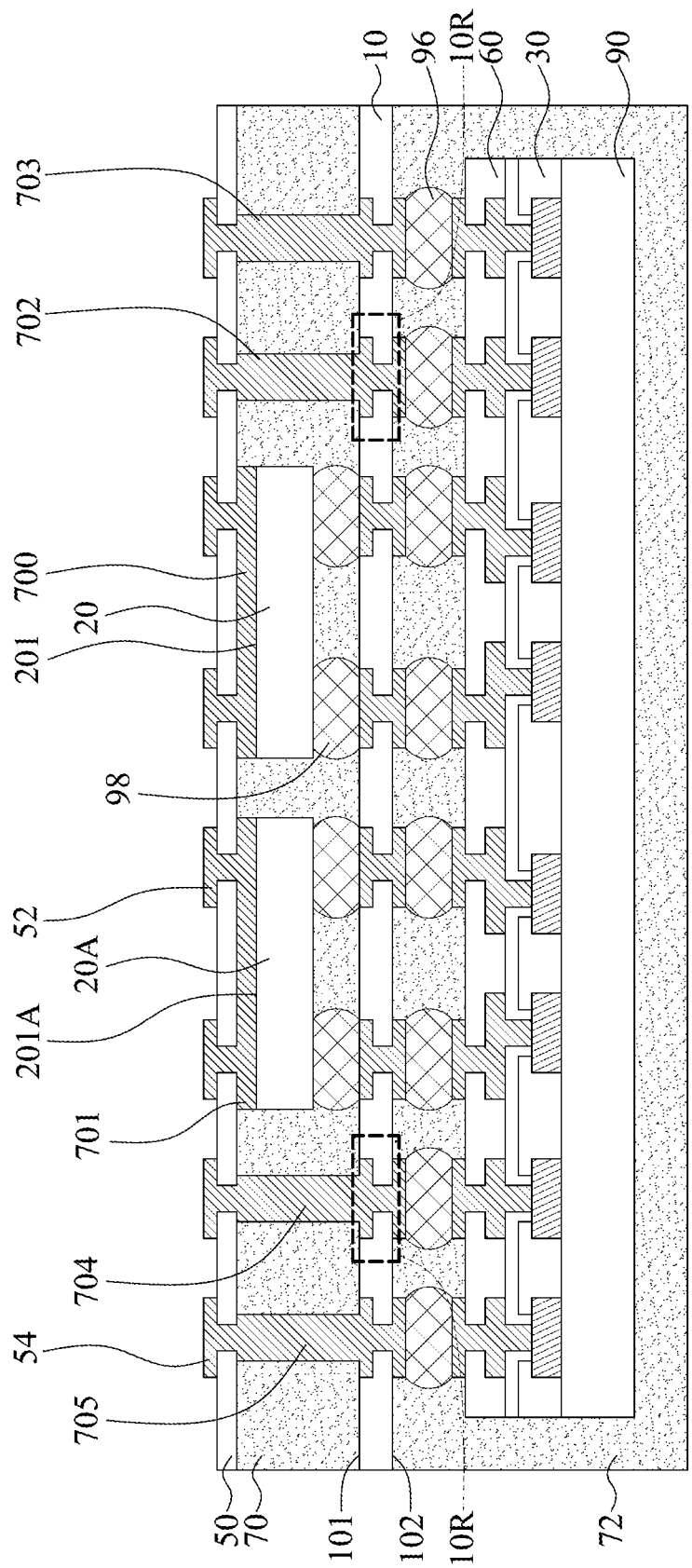

Referring to FIG. 6H, a circuit layer 50 may be formed on the upper surfaces of the heat dissipation elements 700 and 701 and the upper surfaces of the conductive elements 702, 703, 704, and 705. The circuit layer 50 may include one layer of conductive traces or conductive pads and one layer of insulating material. For example, the circuit layer 50 may include thermal pads 52 and conductive pads 54. The thermal pads 52 may be formed on the upper surfaces of the heat dissipation elements 700 and 701, and the conductive pads 54 may be formed on the upper surfaces of the conductive elements 702, 703, 704, and 705.

Figure 6I:
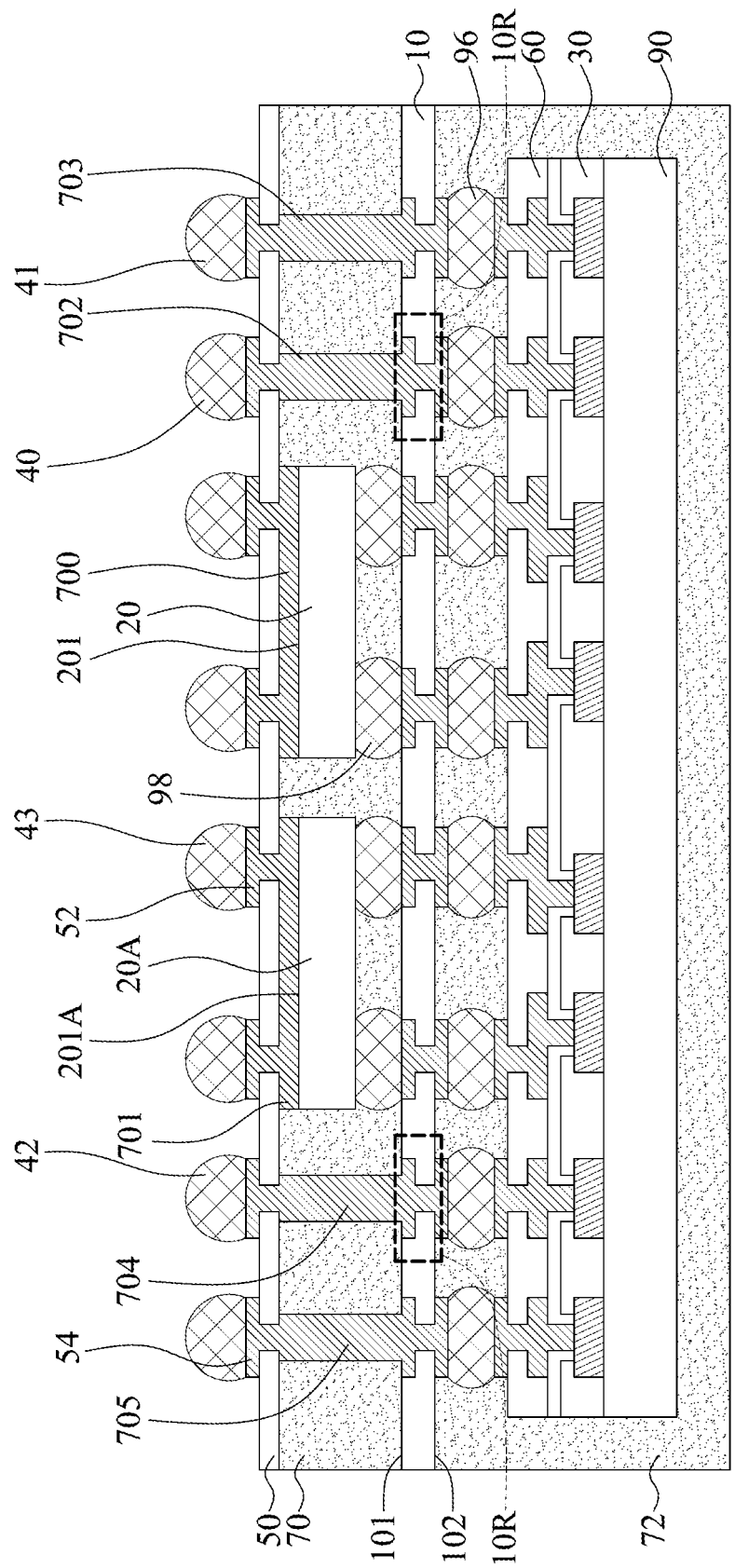

Referring to FIG. 6I, terminals 40, 41, 42, and 43 may be formed on the circuit layer 50. In some embodiments, the terminals 40, 41, 42, and 43 may be or include Au, Ag, Cu, another metal, a solder alloy, or a combination of two or more thereof. In some embodiments, the terminals 40, 41, 42, and 43 may include a C4 bump, a BGA or a LGA. As such, the electronic package 1 is formed.

FIG. 7A, FIG. 7B, FIG. 7C, FIG. 7D, and FIG. 7E illustrate various stages of a method of manufacturing an electronic package 2 in accordance with some embodiments of the present disclosure.

Figure 7A:
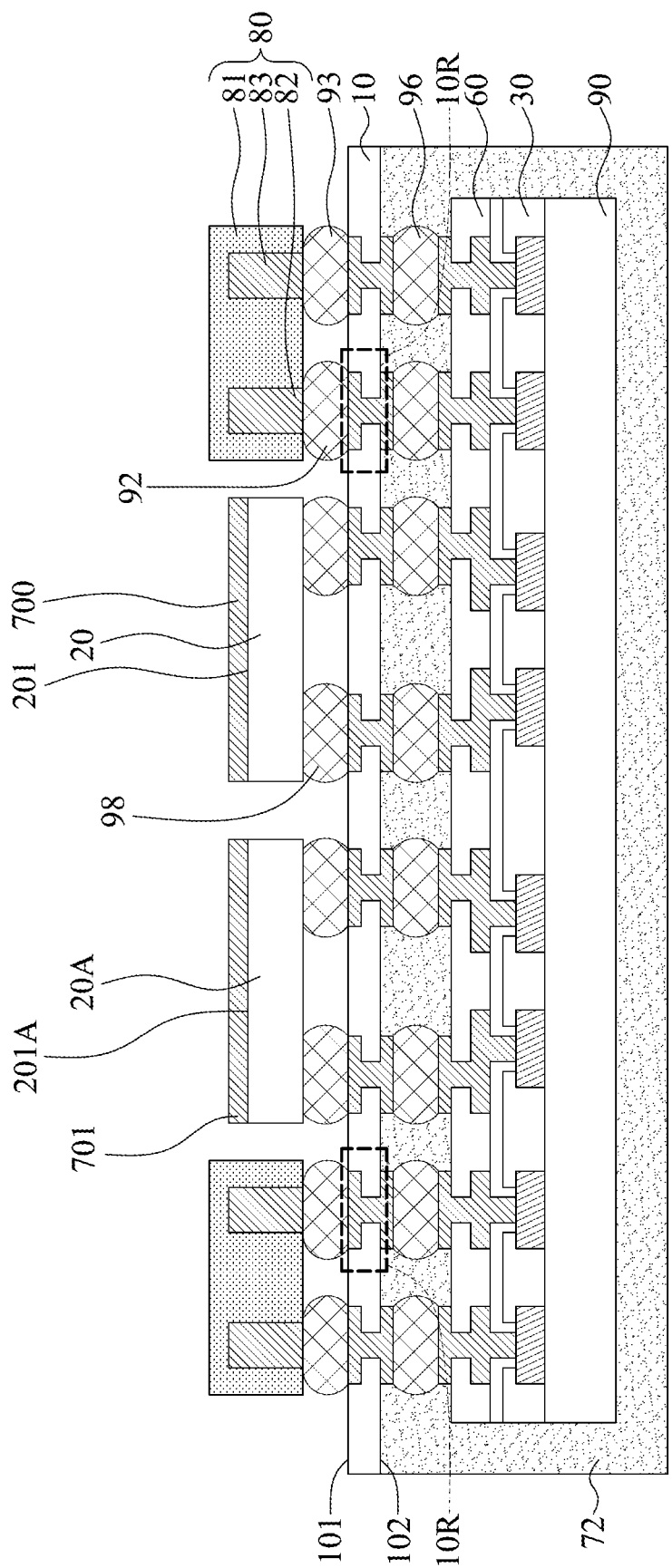
FIG. 7A, FIG. 7B, FIG. 7C, FIG. 7D, and FIG. 7E illustrate various stages of a method of manufacturing an electronic package in accordance with some embodiments of the present disclosure.

Referring to FIG. 7A, operations similar to those illustrated in FIGS. 6A-6D may be performed, amplified circuits 20 and 20A may be bonded to the circuit layer 10 through conductive bumps 98, and connection components 80 may be bonded to the circuit layer 10 through conductive bumps 96. In some embodiments, heat dissipation elements 700 and 701 may be formed on the amplified circuits 20 and 20A prior to or after the amplified circuits 20 and 20A are bonded to the circuit layer 10. In some embodiments, the connection component 80 may include a package body 81 and conductive elements 82 and 83 encapsulated by the package body 81. In some embodiments, the conductive elements 82 and 83 are bonded to the conductive traces or conductive pads of the circuit layer 10 through conductive bumps 96.

Figure 7B:
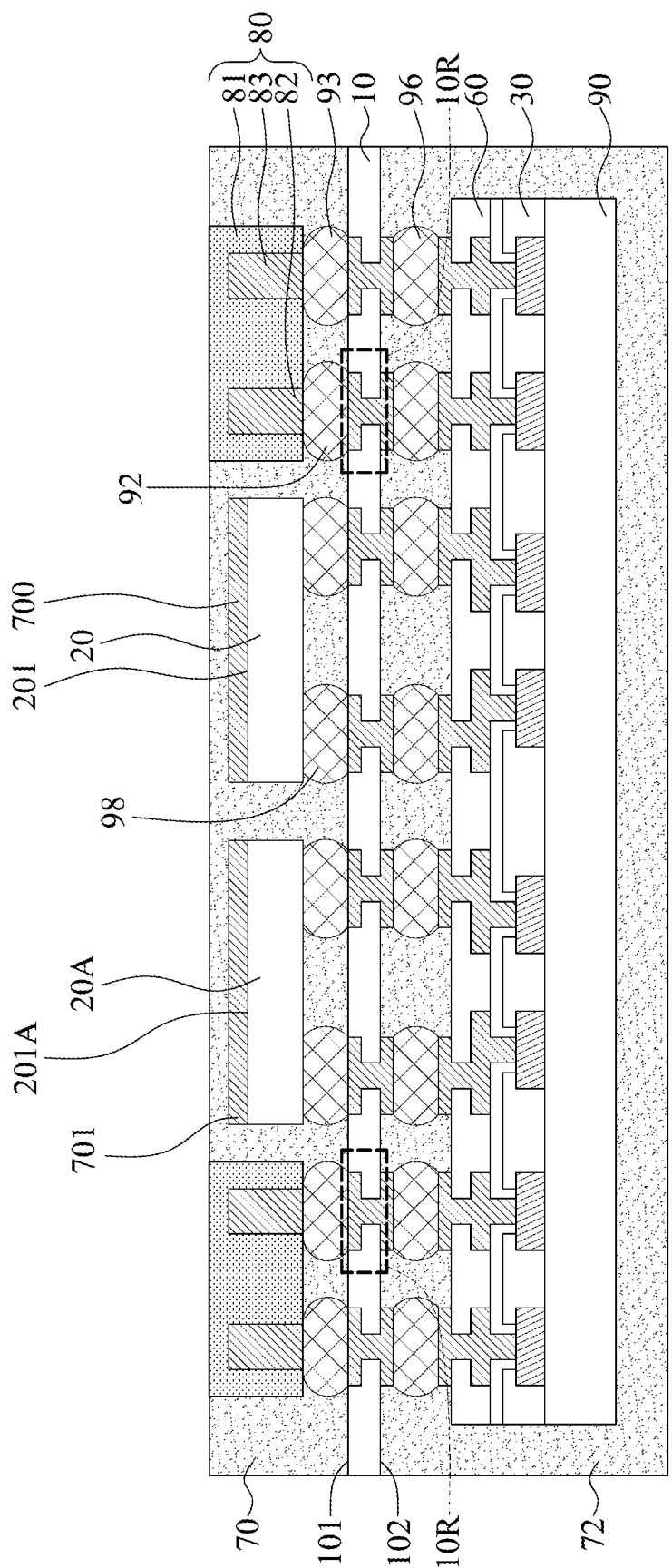

Referring to FIG. 7B, the amplified circuits 20 and 20A, the heat dissipation elements 700 and 701, the conductive bumps 96 and 98, and the connection components 80 may be covered or encapsulated by an element 70. The element 70 may include an encapsulant.

Figure 7C:
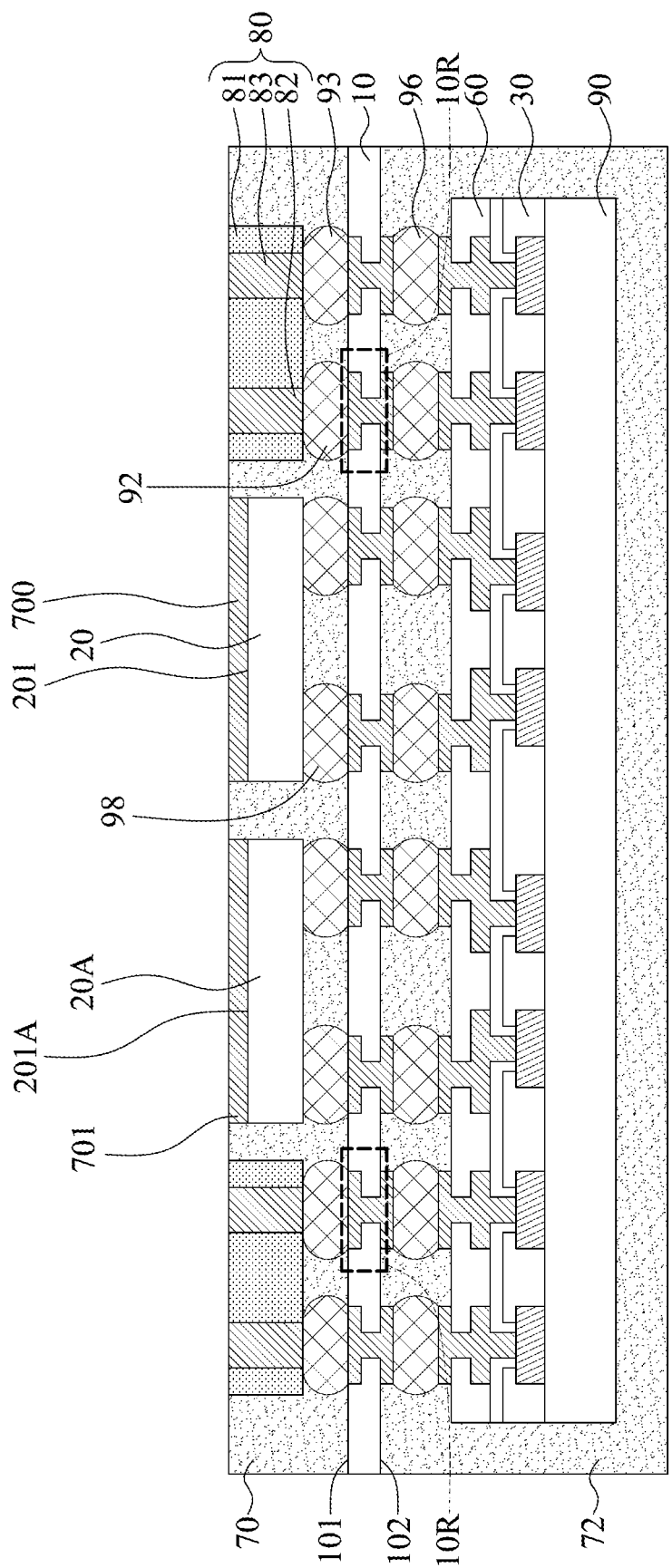

Referring to FIG. 7C, a grinding operation may be performed on the element 70. In some embodiments, the element 70, the heat dissipation elements 700 and 701, and the connection components 80 may be partially removed by the grinding operation to expose upper surfaces of the heat dissipation elements 700 and 701 and upper surfaces of the conductive elements 82 and 83.

Figure 7D:
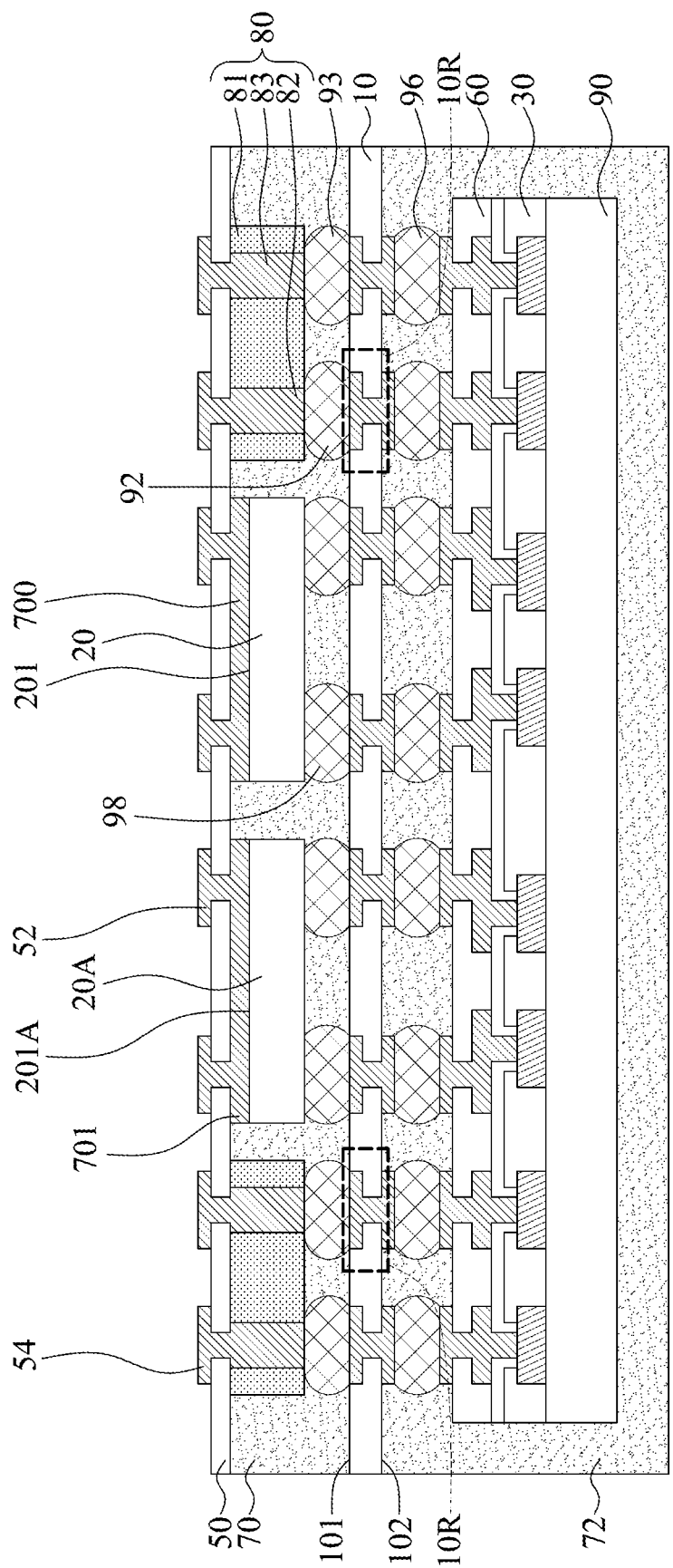

Referring to FIG. 7D, a circuit layer 50 may be formed on the upper surfaces of the heat dissipation elements 700 and 701 and the upper surfaces of the conductive elements 82 and 83. The circuit layer 50 may include one layer of conductive traces or conductive pads and one layer of insulating material. For example, the circuit layer 50 may include thermal pads 52 and conductive pads 54. The thermal pads 52 may be formed on the upper surfaces of the heat dissipation elements 700 and 701, and the conductive pads 54 may be formed on the upper surfaces of the conductive elements 82 and 83.

Figure 7E:
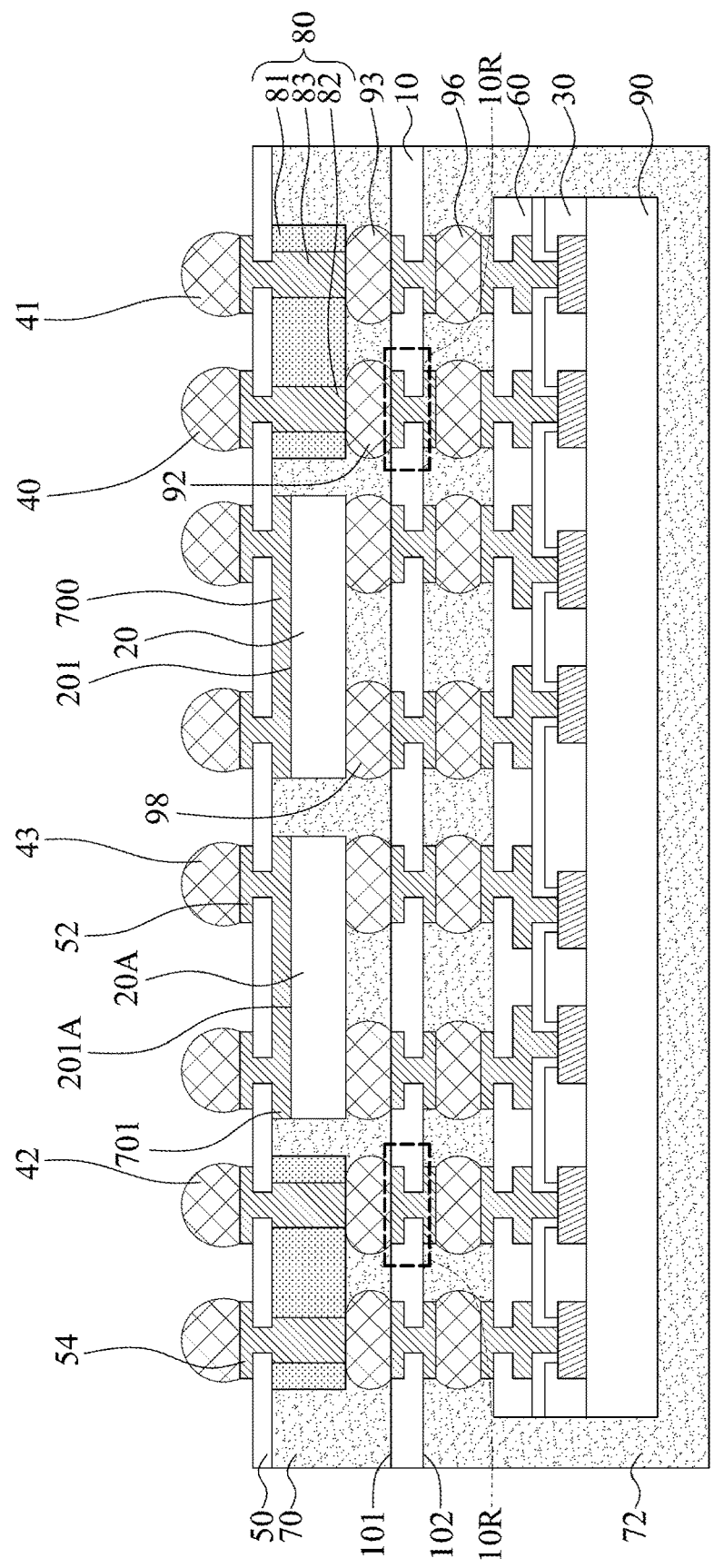

Referring to FIG. 7E, terminals 40, 41, 42, and 43 may be formed on the circuit layer 50. In some embodiments, the terminals 40, 41, 42, and 43 may be or include Au, Ag, Cu, another metal, a solder alloy, or a combination of two or more thereof. In some embodiments, the terminals 40, 41, 42, and 43 may include a C4 bump, a BGA or a LGA. As such, the electronic package 2 is formed.

Figure 8A:
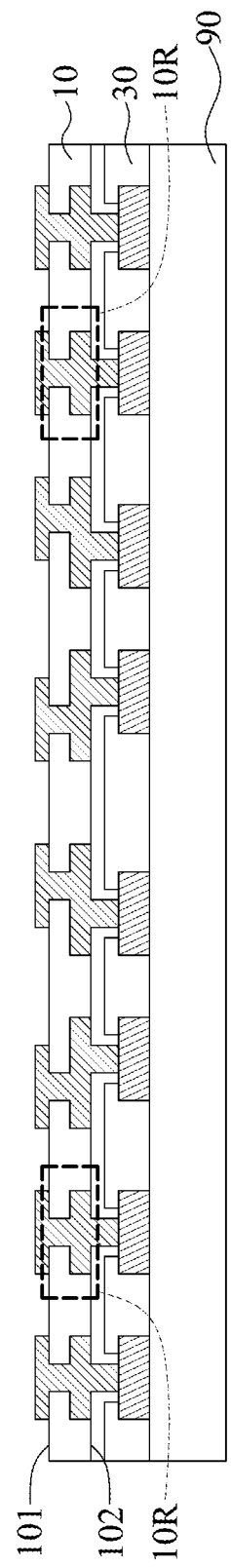
FIG. 8A, FIG. 8B, and FIG. 8C illustrate various stages of a method of manufacturing an electronic package in accordance with some embodiments of the present disclosure.
Figure 8B:
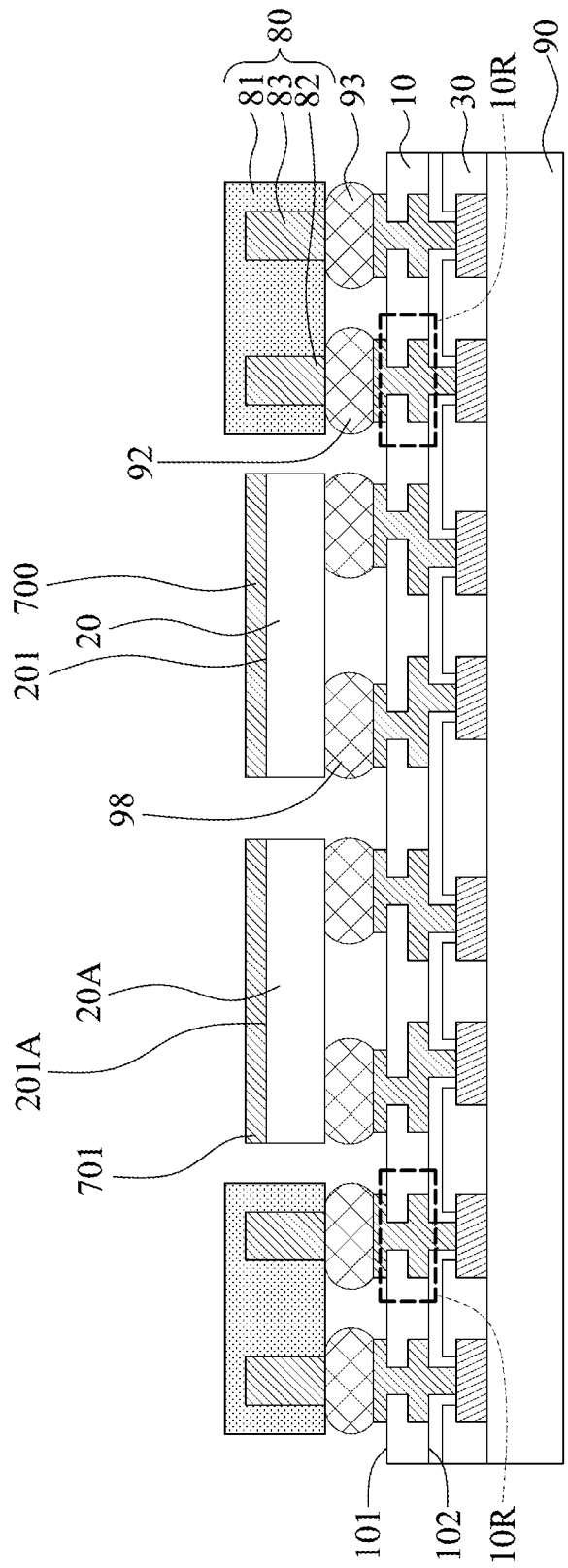
Figure 8C:
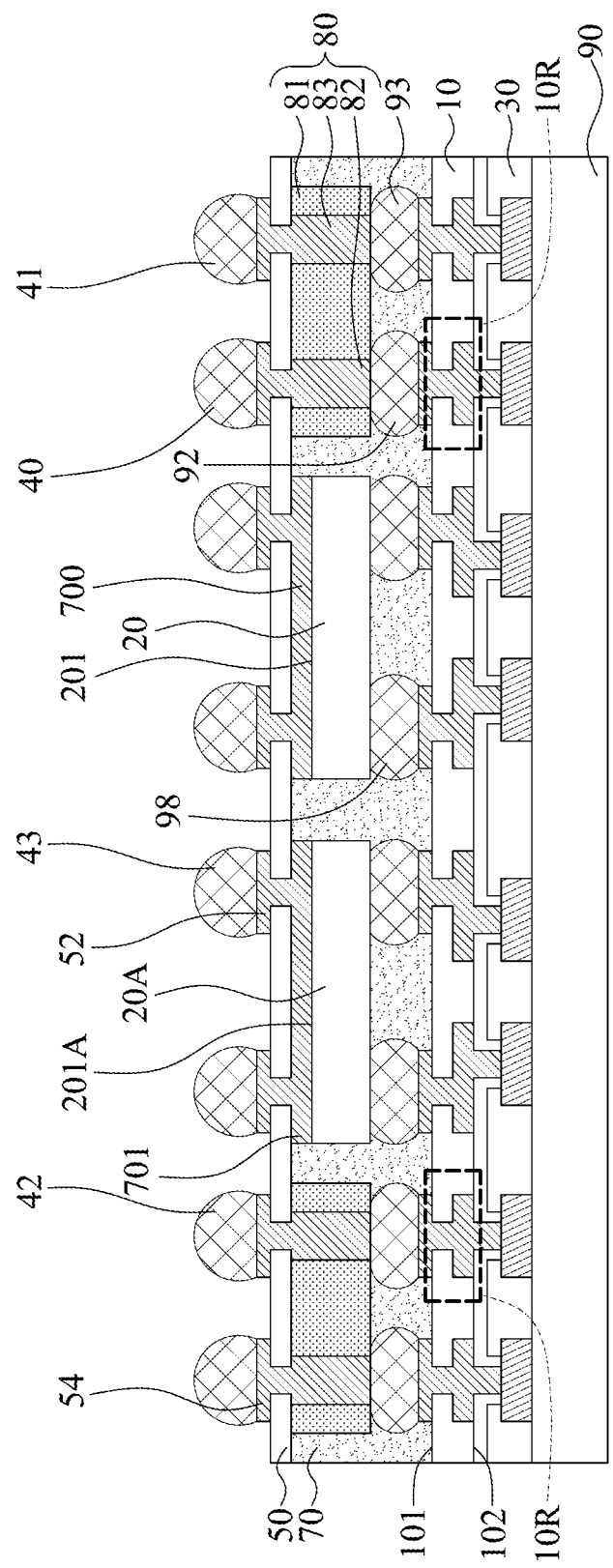

FIG. 8A, FIG. 8B, and FIG. 8C illustrate various stages of a method of manufacturing an electronic package 3 in accordance with some embodiments of the present disclosure.

Referring to FIG. 8A, a substrate 90 may be provided, a control component 30 may be disposed or formed on the substrate 90, and a circuit layer 10 may be formed or disposed on the control component 30. The material for the substrate 90 may include bulk silicon, a semiconductor wafer, a silicon-on-insulator (SOI) substrate, or a silicon germanium substrate. In some embodiments, the substrate 90 may include a silicon-based semiconductor component. The circuit layer 10 may be a RDL including two layers of conductive traces or conductive pads and two layers of insulating material.

Referring to FIG. 8B, amplified circuits 20 and 20A may be bonded to the circuit layer 10 through conductive bumps 98, and connection components 80 may be bonded to the circuit layer 10 through conductive bumps 92 and 93. In some embodiments, heat dissipation elements 700 and 701 may be formed on the amplified circuits 20 and 20A prior to or after the amplified circuits 20 and 20A are bonded to the circuit layer 10. In some embodiments, the connection component 80 may include a package body 81 and conductive elements 82 and 83 encapsulated by the package body 81. In some embodiments, the conductive elements 82 and 83 are bonded to the conductive traces or conductive pads of the circuit layer 10 through conductive bumps 92 and 93.

Referring to FIG. 8C, operations similar to those illustrated in FIGS. 7B-7E may be performed to form an circuit layer 50 on exposed upper surfaces of the heat dissipation elements 700 and 701 and exposed upper surfaces of the conductive elements 82 and 83, and terminals 40, 41, 42, and 43 may be formed on the circuit layer 50. As such, the electronic package 3 is formed.

FIG. 9A, FIG. 9B, FIG. 9C, FIG. 9D, FIG. 9E, FIG. 9F, and FIG. 9G illustrate various stages of a method of manufacturing an electronic package 4 in accordance with some embodiments of the present disclosure.

Figure 9A:
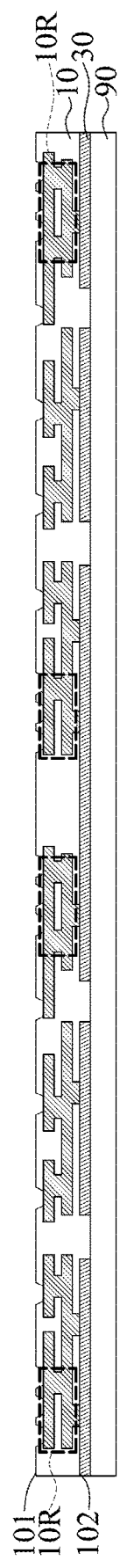
FIG. 9A, FIG. 9B, FIG. 9C, FIG. 9D, FIG. 9E, FIG. 9F, and FIG. 9G illustrate various stages of a method of manufacturing an electronic package in accordance with some embodiments of the present disclosure.

Referring to FIG. 9A, a substrate 90 may be provided, a control component 30 may be disposed or formed on the substrate 90, and a circuit layer 10 may be formed or disposed on the control component 30. The circuit layer 10 may be a RDL including two layers of conductive traces or conductive pads and two layers of insulating material. The topmost layer of insulating material may have openings that expose portions of the conductive pads of the circuit layer 10. The material for the substrate 90 may include bulk silicon, a semiconductor wafer, a silicon-on-insulator (SOI) substrate, or a silicon germanium substrate. In some embodiments, the substrate 90 may include a silicon-based semiconductor component. In some embodiments, the substrate 90 may be an 8-inch semiconductor wafer.

Figure 9B:
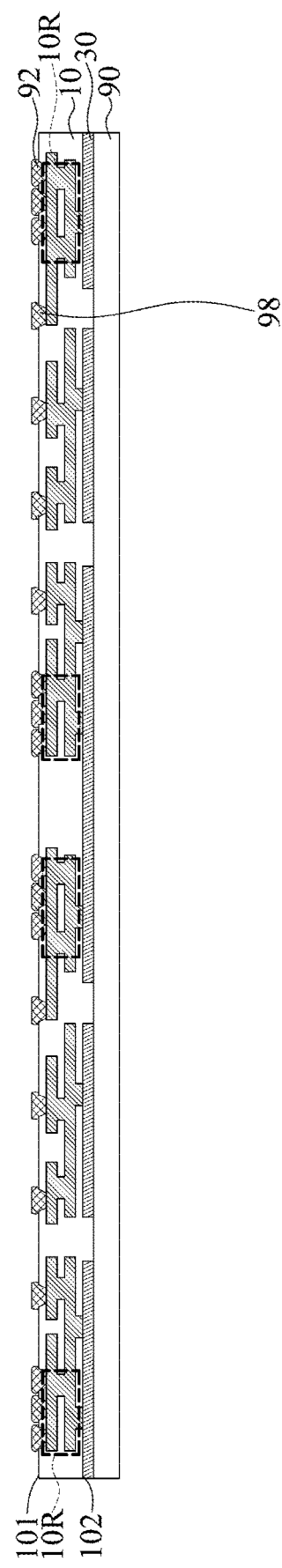

Referring to FIG. 9B, conductive bumps 92 and 98 may be formed on the circuit layer 10. In some embodiments, the conductive bumps 92 and 98 are formed in the openings of the topmost layer of insulating material to connect to the topmost layer of conductive pads of the circuit layer 10.

Figure 9C:
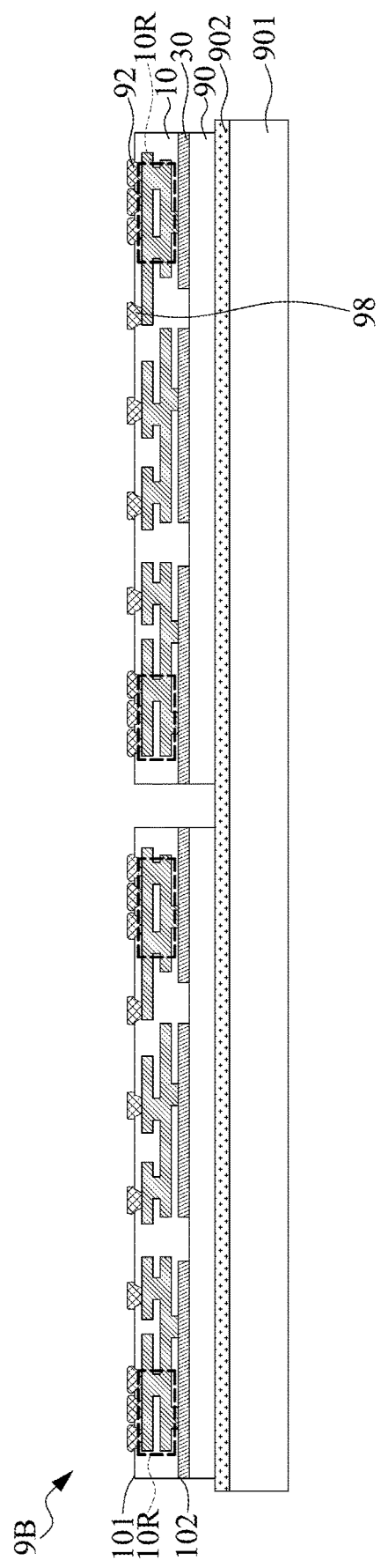

Referring to FIG. 9C, the structure illustrated in FIG. 9B may be cut or diced into a plurality of intermediate structures 9B, which may be disposed on a carrier 901. In some embodiments, a buffer layer 902 may be disposed between the intermediate structures 9B and the carrier 901. The carrier 901 may be a 12-inch rigid carrier, such as a glass carrier. The buffer layer 902 may be a release film or an adhesive layer.

Figure 9D:
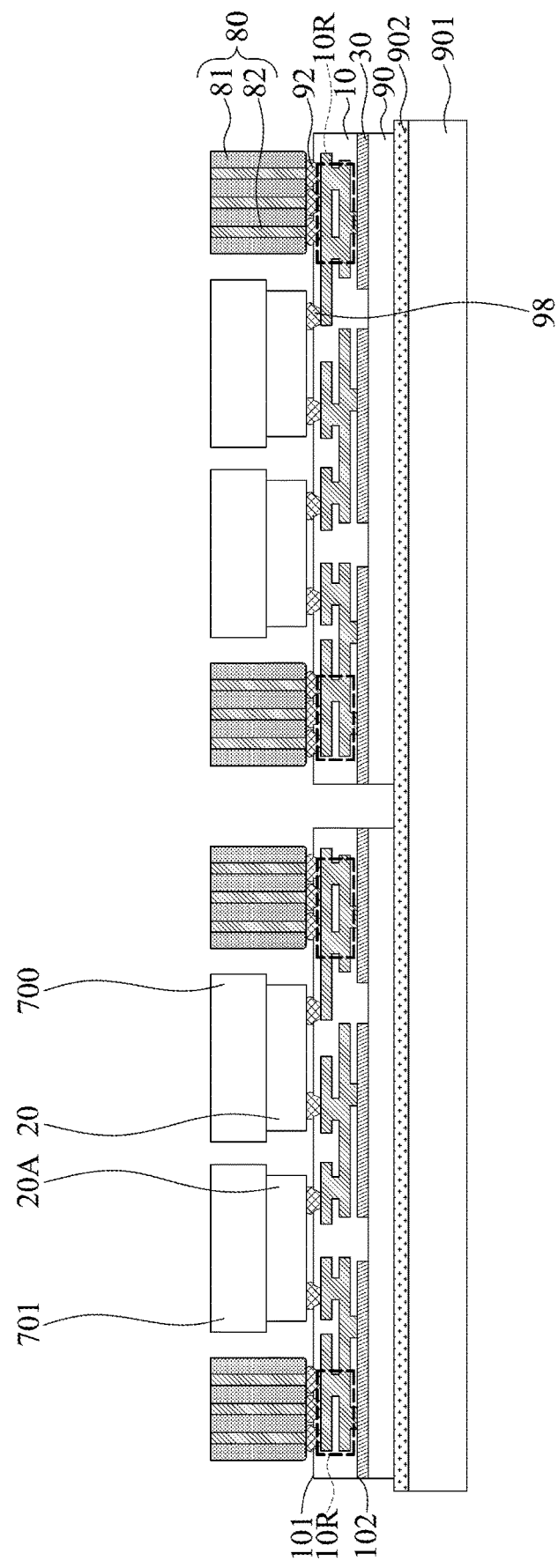

Referring to FIG. 9D, operations similar to those illustrated in FIG. 8B may be performed to bond amplified circuits 20 and 20A to the circuit layer 10 through conductive bumps 98, and bond connection components 80 to the circuit layer 10 through conductive bumps 92 and 93.

Figure 9E:
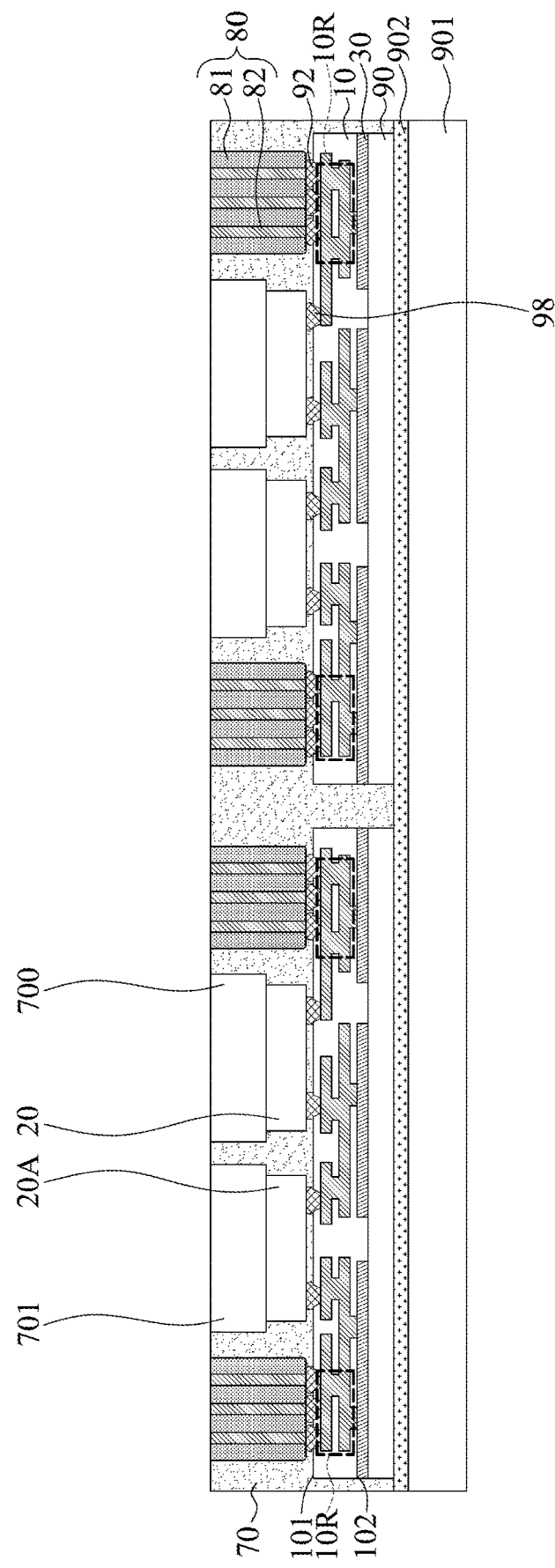

Referring to FIG. 9E, the amplified circuits 20 and 20A, the heat dissipation elements 700 and 701, the conductive bumps 92, 93, and 98, the connection components 80, and the substrates 90 may be covered or encapsulated by an element 70, and a grinding operation may be performed on the element 70. The element 70 may include an encapsulant. In some embodiments, the element 70, the heat dissipation elements 700 and 701, and the connection components 80 may be partially removed by the grinding operation to expose upper surfaces of the heat dissipation elements 700 and 701 and upper surfaces of the conductive elements 82.

Figure 9F:
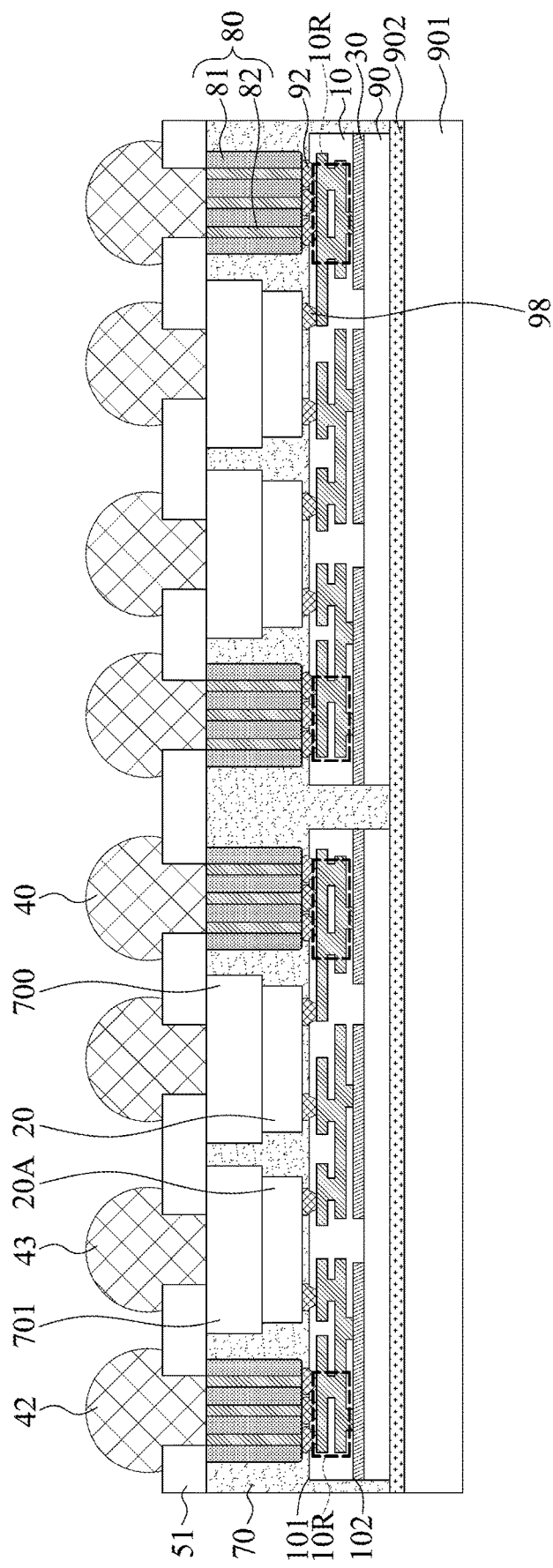

Referring to FIG. 9F, a circuit layer 51 may be formed on the element 70, the heat dissipation elements 700 and 701, and the connection component 80, and terminals 40, 42, and 43 may be formed on the heat dissipation elements 700 and 701 and the connection component 80. In some embodiments, the circuit layer 51 includes an insulating layer having a plurality of openings exposing the upper surfaces of the heat dissipation elements 700 and 701 and the upper surfaces of the conductive elements 82. In some embodiments, the terminals 40 and 42 are formed on the conductive elements 82 through the openings of the insulating layer of the circuit layer 51. In some embodiments, the terminals 43 are formed on the heat dissipation elements 700 and 701 through the openings of the insulating layer of the circuit layer 51.

Figure 9G:
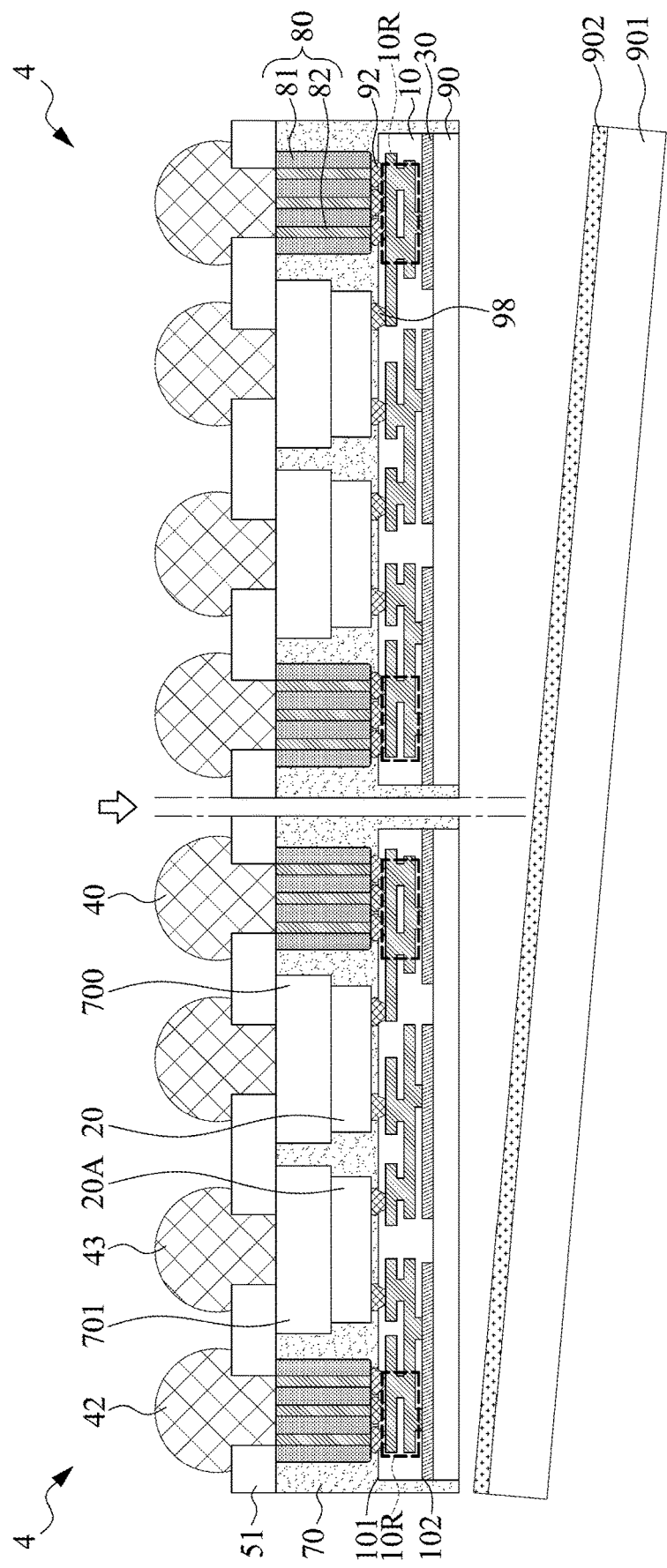

Referring to FIG. 9G, a singulation operation may be performed on the circuit layer 51 and the element 70, and the carrier 901 may be removed. The buffer layer 902 may be removed with the carrier 901. As such, the electronic package 4 is formed.

According to some embodiments of the present disclosure, a plurality of intermediate structures (e.g., the intermediate structures 9B) may be formed and encapsulated on one semiconductor wafer, and the electronic package may be formed by singulation. Therefore, the unit per hour (UPH) of the electronic package can be significantly increased.

FIG. 10A, FIG. 10B, FIG. 10C, FIG. 10D, FIG. 10E, FIG. 10F, and FIG. 10G illustrate various stages of a method of manufacturing an electronic package in accordance with some embodiments of the present disclosure.

Figure 10A:
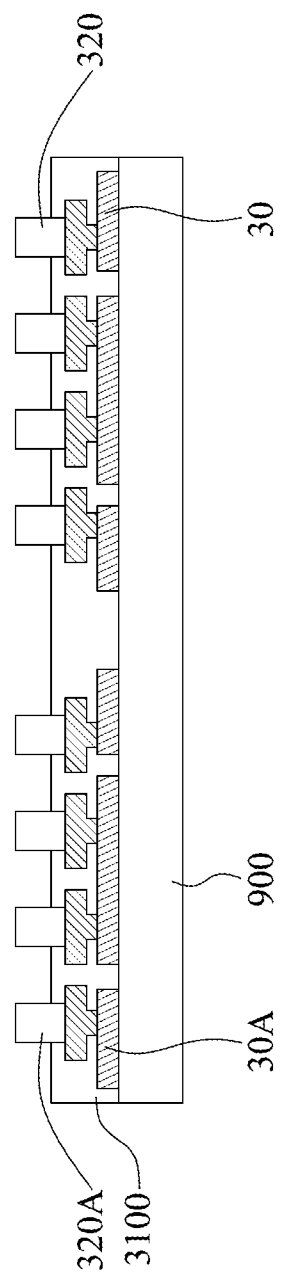
FIG. 10A, FIG. 10B, FIG. 10C, FIG. 10D, FIG. 10E, FIG. 10F, and FIG. 10G illustrate various stages of a method of manufacturing an electronic package in accordance with some embodiments of the present disclosure.

Referring to FIG. 10A, a substrate 900 may be provided, control components 30 and 30A may be disposed or formed on the substrate 900, an RDL 3100 may be formed or disposed on the control components 30 and 30A, and conductive elements 320 and 320A may be formed on the RDL 3100. The RDL 3100 may include one or two layers of conductive traces or conductive pads and one or two layers of insulating material. The topmost layer of insulating material may have openings that expose portions of the conductive pads of the RDL 3100. The conductive elements 320 and 320A may be formed on the exposed portions of the conductive pads of the RDL 3100 through the openings of the topmost layer of insulating material. The material for the substrate 900 may include bulk silicon, a semiconductor wafer, a silicon-on-insulator (SOI) substrate, or a silicon germanium substrate. In some embodiments, the substrate 900 may include a silicon-based semiconductor component. In some embodiments, the substrate 900 may be an 8-inch semiconductor wafer.

Figure 10B:
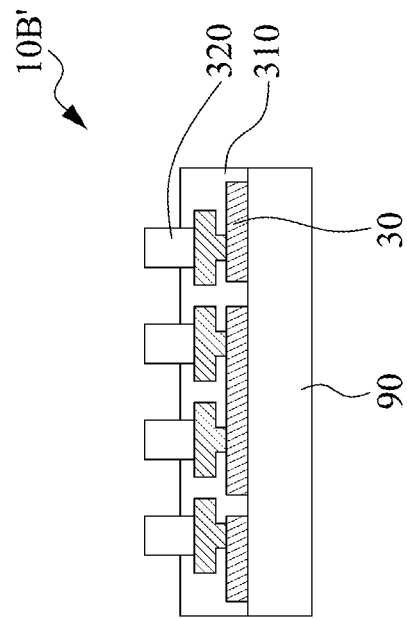
Figure 10B:
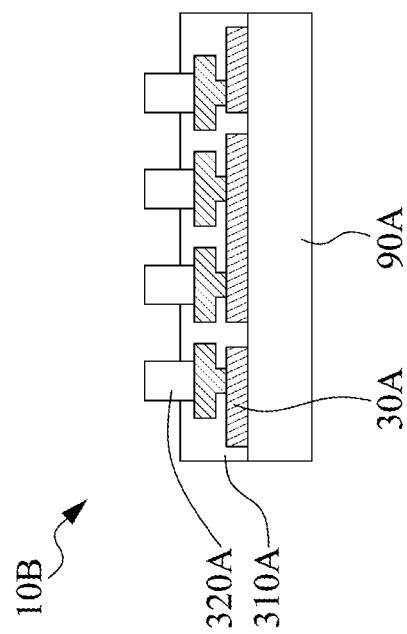

Referring to FIG. 10B, the structure illustrated in FIG. 10A may be cut or diced into a plurality of the intermediate structures 10B and 10B'.

Figure 10C:
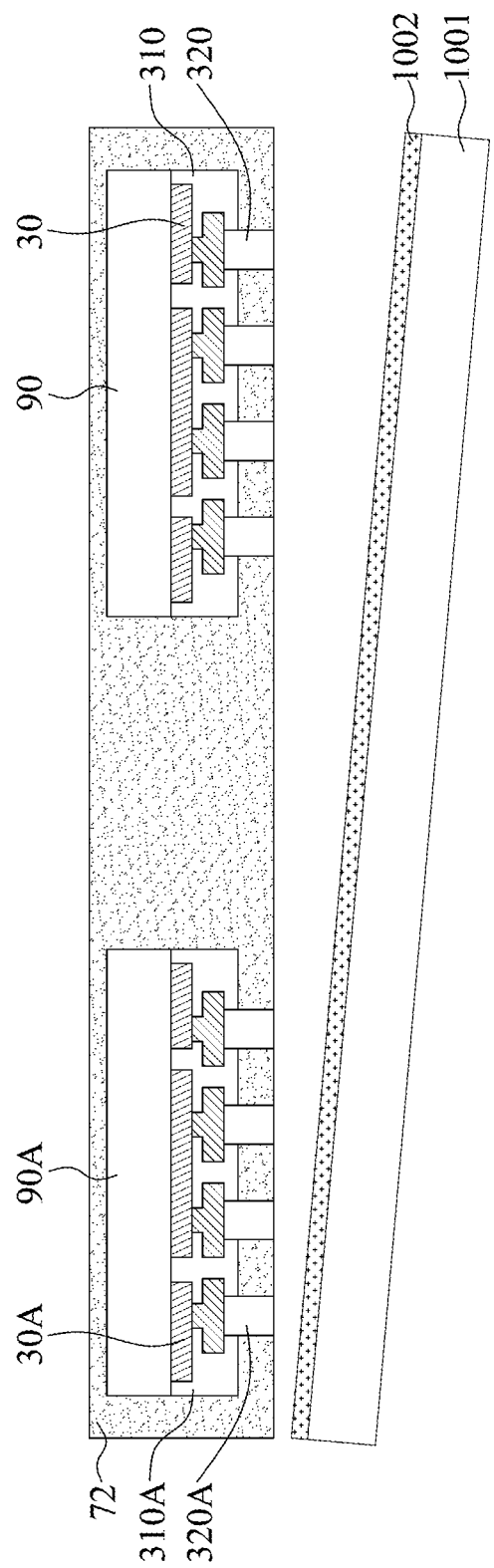
Figure 10D:
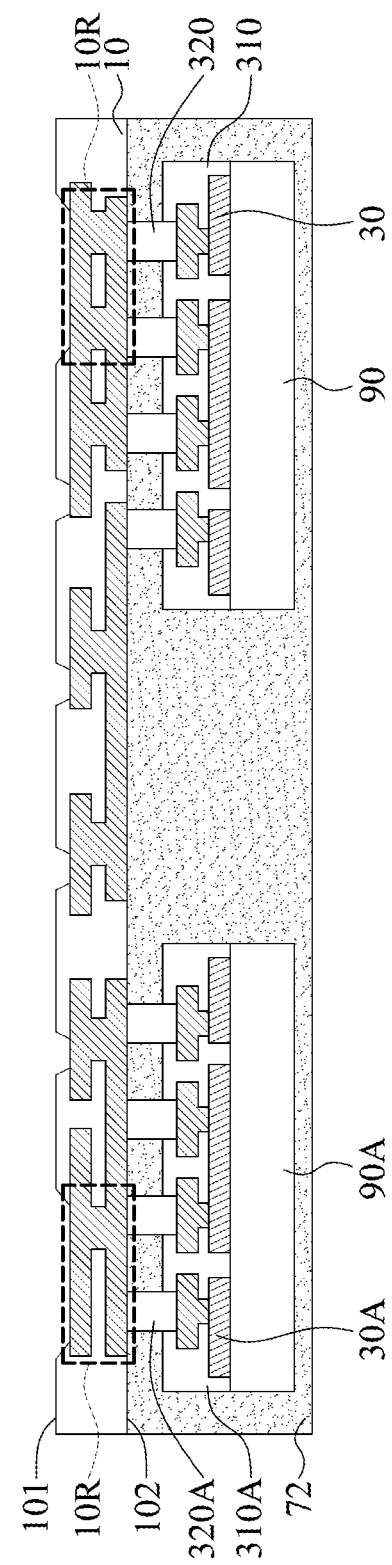

Referring to FIG. 10C, the intermediate structures 10B and 10B' may be disposed on a circuit layer 1001, the intermediate structures 10B and 10B' may be covered or encapsulated by an element 72, and then the circuit layer 1001 may be removed. In some embodiments, a buffer layer 1002 may be disposed between the intermediate structures 10B and 10B' and the circuit layer 1001. The circuit layer 1001 may be a 12-inch rigid carrier, such as a glass carrier. The buffer layer 1002 may be a release film or an adhesive layer.

Referring to FIG. 10C, the structure illustrated in FIG. 10B is flipped by about 180°, and a circuit layer 10 may be formed or disposed on the control component 30. The circuit layer 10 may be a RDL including one or two layers of conductive traces or conductive pads and one or two layers of insulating material. The topmost layer of insulating material may have openings that expose portions of the conductive pads of the circuit layer 10. In some embodiments, the conductive traces or conductive pads of the circuit layer 10 electrically connect to the conductive elements 320 and 320A.

Figure 10E:
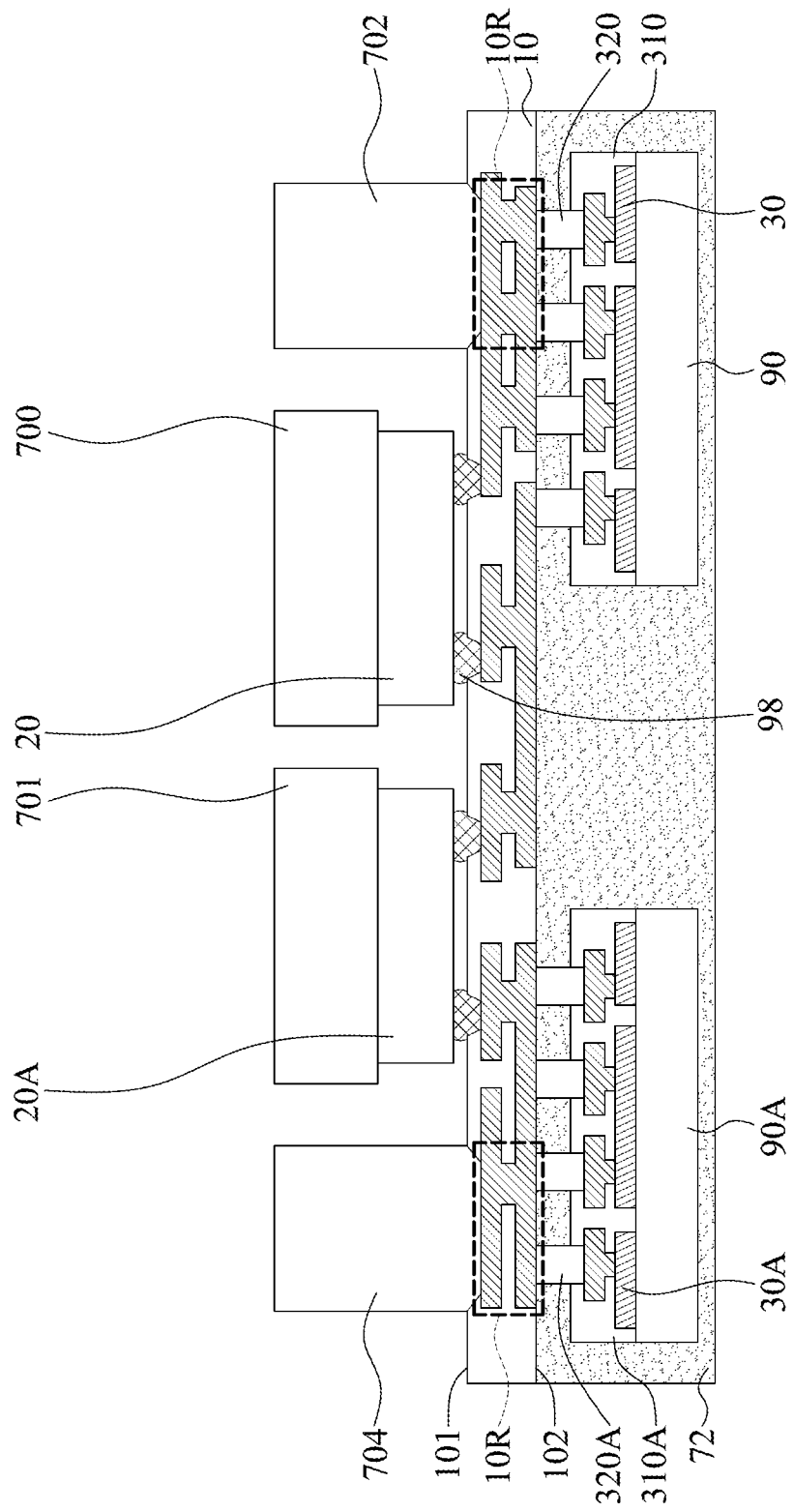

Referring to FIG. 10E, amplified circuits 20 and 20A may be bonded to the circuit layer 10 through conductive bumps 98, and conductive elements 702 and 704 may be formed on the circuit layer 10. In some embodiments, the conductive elements 702 and 704 are formed by plating. In some embodiments, heat dissipation elements 700 and 701 may be formed on the amplified circuits 20 and 20A prior to or after the amplified circuits 20 and 20A are bonded to the circuit layer 10.

Figure 10F:
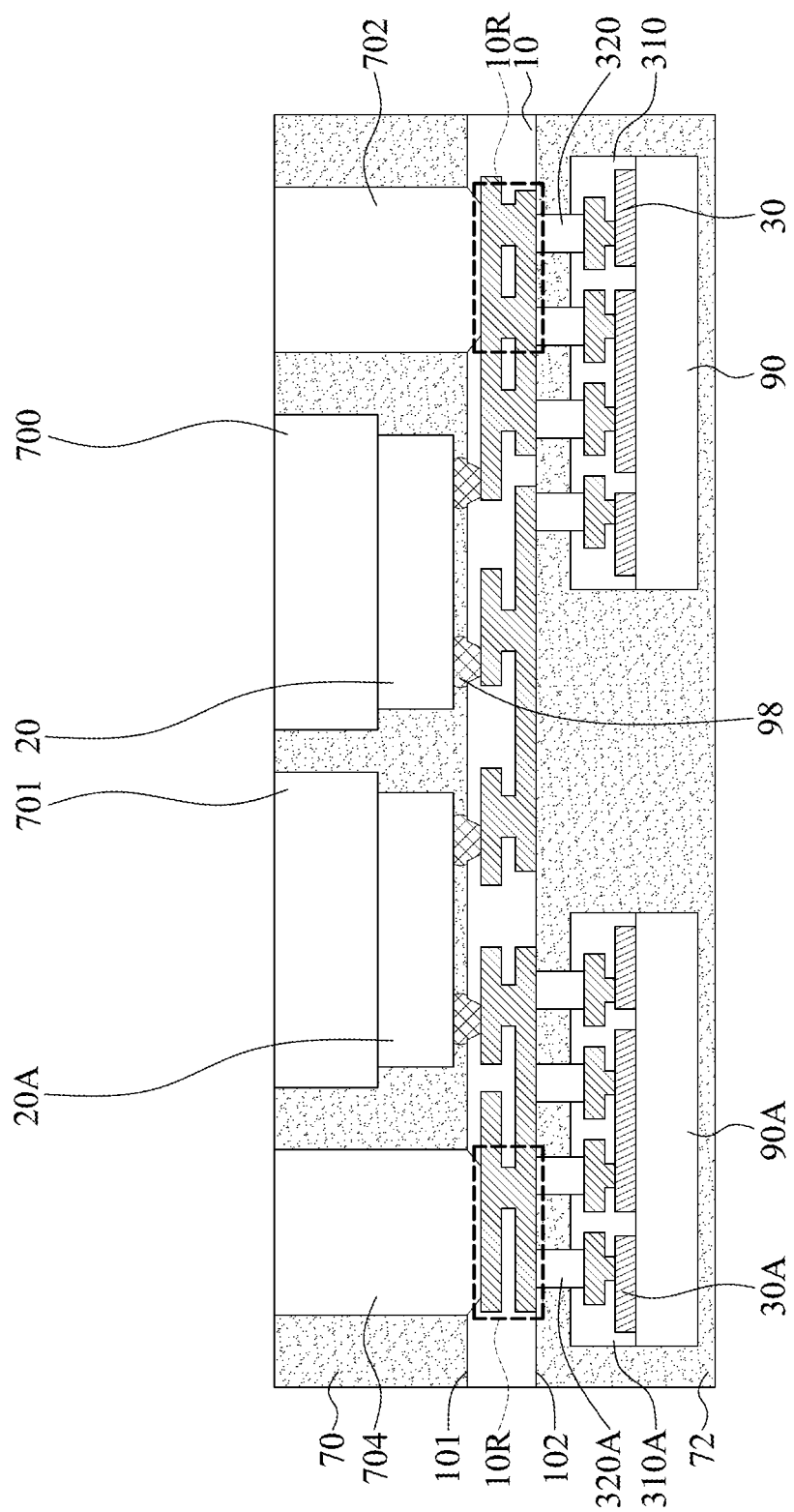

Referring to FIG. 10F, the amplified circuits 20 and 20A, the heat dissipation elements 700 and 701, the conductive bumps 98, and the conductive elements 702 and 704 may be covered or encapsulated by an element 70, and a grinding operation may be performed on the element 70. The element 70 may include an encapsulant. In some embodiments, the element 70, the heat dissipation elements 700 and 701, and the conductive elements 702 and 704 may be partially removed by the grinding operation to expose upper surfaces of the heat dissipation elements 700 and 701 and upper surfaces of the conductive elements 702 and 704.

Figure 10G:
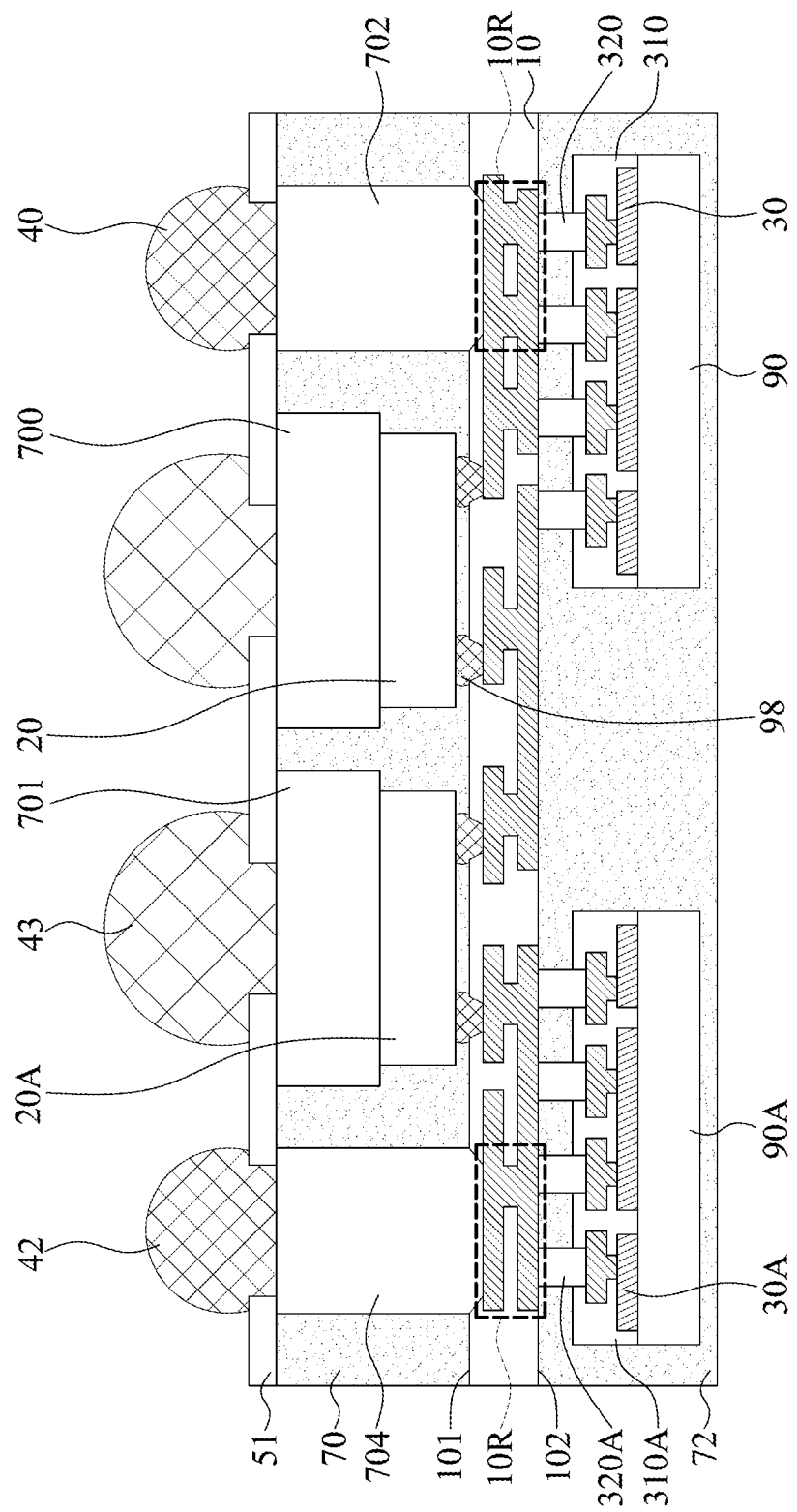

Referring to FIG. 10G, a circuit layer 51 may be formed on the element 70, the heat dissipation elements 700 and 701, and the conductive elements 702 and 704, and terminals 40, 42, and 43 may be formed on the heat dissipation elements 700 and 701 and the conductive elements 702 and 704. In some embodiments, the circuit layer 51 includes an insulating layer having a plurality of openings exposing the upper surfaces of the heat dissipation elements 700 and 701 and the upper surfaces of the conductive elements 702 and 704. In some embodiments, the terminals 40 and 42 are formed on the conductive elements 702 and 704, respectively, through the openings of the insulating layer of the circuit layer 51. In some embodiments, the terminals 43 are formed on the heat dissipation elements 700 and 701 through the openings of the insulating layer of the circuit layer 51. As such, the electronic package 5 is formed.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than or no greater than 0.5 µm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component. In the description of some embodiments, a component provided "under" or "below" another component can encompass cases where the former component is directly below (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An electronic package, comprising:
   a first circuit layer having a first surface and a second surface opposite to the first surface;
   an amplifier component connected to the first surface through a first conductive bump; and
   a control component connected to the second surface of the first circuit layer through a second conductive bump;
   wherein the control component is configured to transmit a first signal to the amplifier component and to output a second signal amplified by the amplifier component, and wherein the first conductive bump and the second conductive bump are within a projection of the control component.

2. The electronic package of claim 1, further comprising an encapsulant including a molding compound on the second surface of the first circuit layer, wherein the control component is spaced apart from the first circuit layer by the second conductive bump and a portion of the encapsulant.

3. The electronic package of claim 2, further comprising a redistribution layer (RDL) between and electrically connected to the control component and the first circuit layer, wherein the second conductive bump directly contacts the RDL and the first circuit layer.

4. The electronic package of claim 3, wherein the RDL is configured to transmit the first signal to the amplifier component and transmit the second signal amplified by the amplifier component.

5. The electronic package of claim 3, wherein the second conductive bump, the RDL, and the control component are covered by and contact the encapsulant.

6. The electronic package of claim 1, further comprising:
an encapsulant including a molding compound on the first surface of the first circuit layer; and
a first conductive pillar adjacent to the amplifier component and connected to the first circuit layer, wherein the first conductive pillar is configured to transmit a control signal, and the first conductive pillar, the first conductive bump, and the amplifier component are covered by and contact the encapsulant.

7. The electronic package of claim 6, further comprising a second conductive pillar between the first conductive pillar and the amplifier component and connected to the first circuit layer, wherein the second conductive pillar is configured to transmit a power signal, the power signal comprises the first signal, the second conductive pillar is covered by and contacts the encapsulant.

8. The electronic package of claim 1, wherein a projection of the amplifier component is within a surface of the control component.

9. An electronic package, comprising:
a first circuit layer;
an amplifier component adjacent to a first surface of the first circuit layer;
a control component adjacent to a second surface opposite to the first surface of the first circuit layer and configured to transmit a first signal to the amplifier component and to output a second signal amplified by the amplifier component through the first circuit layer; and
a second circuit layer over the first circuit layer, the amplifier component, and the control component, wherein the second circuit layer comprises:
a plurality of conductive pads; and
an input solder bump and an output solder bump connected to the control component through the conductive pads and within a projection of the control component.

10. The electronic package of claim 9, wherein an edge of the first circuit layer is spaced apart from and substantially aligns with an edge of the second circuit layer.

11. The electronic package of claim 10, further comprising an encapsulant encapsulating the amplifier component, wherein an edge of the encapsulant substantially aligns with the edge of the second circuit layer.

12. The electronic package of claim 10, further comprising an encapsulant encapsulating the control component, wherein an edge of the encapsulant substantially aligns with the edge of the first circuit layer.

13. The electronic package of claim 9, wherein the second circuit layer has a lower surface connected to an inactive surface of the amplifier component, and the amplifier component is disposed between the first surface of the first circuit layer and the lower surface of the second circuit layer.

14. The electronic package of claim 13, further comprising a heat dissipation metal layer between and contacting the inactive surface of the amplifier component and the lower surface of the second circuit layer.

15. An electronic package, comprising:
a control component;
a first amplifier component and a second amplifier component arranged next to each other and disposed over the control component;
a first circuit layer connecting the control component to the first amplifier component and the second amplifier component; and
a connection component disposed adjacent to the first amplifier component and connected to the first circuit layer, the connection component comprising:
a package body including a molding compound; and
a plurality of conductive pillars encapsulated by the molding compound and spaced apart from the first amplifier component.

16. The electronic package of claim 15, further comprising an encapsulant encapsulating and contacting the first circuit layer, the control component, the connection component, the first amplifier component, and the second amplifier component.

17. The electronic package of claim 16, further comprising:
a first heat dissipation metal layer connected to an inactive surface of the first amplifier component and covered by the encapsulant; and
a second heat dissipation metal layer connected to an inactive surface of the second amplifier component and covered by the encapsulant.

18. The electronic package of claim 17, further comprising a second circuit layer contacting the encapsulant and the connection component and electrically connected to the first circuit layer through the connection component.

19. The electronic package of claim 15, further comprising:
a first conductive bump electrically connecting the first amplifier component to the first circuit layer; and
a second conductive bump electrically connecting the second amplifier component to the first circuit layer.

20. The electronic package of claim 19, further comprising an encapsulant encapsulating and contacting the first amplifier component, the second amplifier component, the first conductive bump, and the second conductive bump.

* * * * *